US012580038B2

(12) United States Patent
Park et al.

(10) Patent No.: US 12,580,038 B2
(45) Date of Patent: Mar. 17, 2026

(54) GENERATION OF SOFT DECISION DATA FOR MEMORY DEVICES

(71) Applicant: SAMSUNG ELECTRONICS CO., LTD., Suwon-si (KR)

(72) Inventors: Sehwan Park, Suwon-si (KR); Jinyoung Kim, Suwon-si (KR); Jisang Lee, Suwon-si (KR); Hyojung Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 18/655,941

(22) Filed: May 6, 2024

(65) Prior Publication Data

US 2025/0054563 A1     Feb. 13, 2025

(30) Foreign Application Priority Data

Aug. 10, 2023    (KR) ........................ 10-2023-0105135
Oct. 13, 2023    (KR) ........................ 10-2023-0137038

(51) Int. Cl.
     *G11C 29/52*      (2006.01)
     *G11C 7/10*      (2006.01)
     *G11C 7/22*      (2006.01)

(52) U.S. Cl.
     CPC .............. *G11C 29/52* (2013.01); *G11C 7/106* (2013.01); *G11C 7/1069* (2013.01); *G11C 7/222* (2013.01)

(58) Field of Classification Search
     CPC ....... G11C 29/52; G11C 7/106; G11C 7/1069; G11C 7/222

USPC ...................................................... 365/185.09
See application file for complete search history.

(56) References Cited

U.S. PATENT DOCUMENTS

| | | | |
|---|---|---|---|
| 8,576,622 B2 | 11/2013 | Yoon et al. | |
| 9,001,587 B2 | 4/2015 | Eun et al. | |
| 9,190,174 B2 | 11/2015 | Parthasarathy et al. | |
| 9,460,783 B2 | 10/2016 | Moschiano et al. | |
| 10,373,691 B2 | 8/2019 | Jung | |
| 10,733,047 B2 | 8/2020 | El Gamal et al. | |
| 11,017,841 B2 | 5/2021 | Yoon | |
| 2013/0250698 A1* | 9/2013 | Kim | G11C 16/26 |
| | | | 365/185.25 |
| 2014/0071761 A1 | 3/2014 | Sharon et al. | |
| 2024/0078038 A1* | 3/2024 | Li | G11C 16/26 |

\* cited by examiner

*Primary Examiner* — Alexander Sofocleous
*Assistant Examiner* — Duy H Luong
(74) *Attorney, Agent, or Firm* — Fish & Richardson P.C.

(57) ABSTRACT

A memory device includes a memory cell array, a control logic which controls a read operation to read hard decision data and soft decision data from each page, and a page buffer which includes a first latch related to sensing of the hard decision data and a second latch related to sensing of the soft decision data. The control logic controls performing a first sensing operation of storing a value determined based on a first offset level, in the second latch, at a first sensing timing, and a second sensing operation of storing a value determined based on a second offset level, in the second latch, at a second sensing timing, and performs a control operation to provide a set signal SET to the second latch in the first sensing operation, and provide a reset signal RST to the second latch in the second sensing operation.

20 Claims, 23 Drawing Sheets

FIG. 2
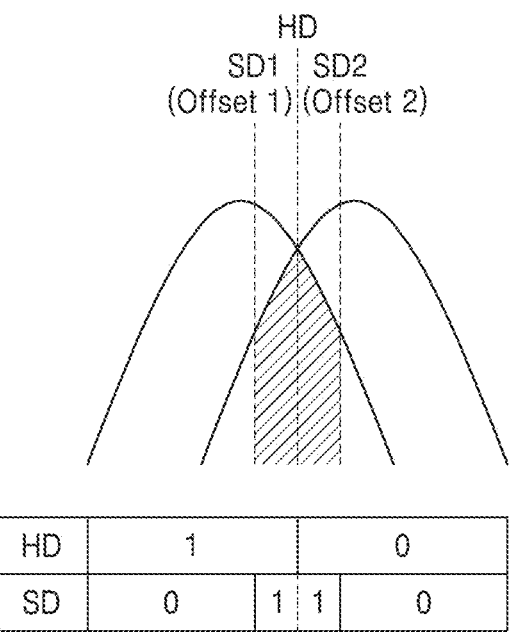
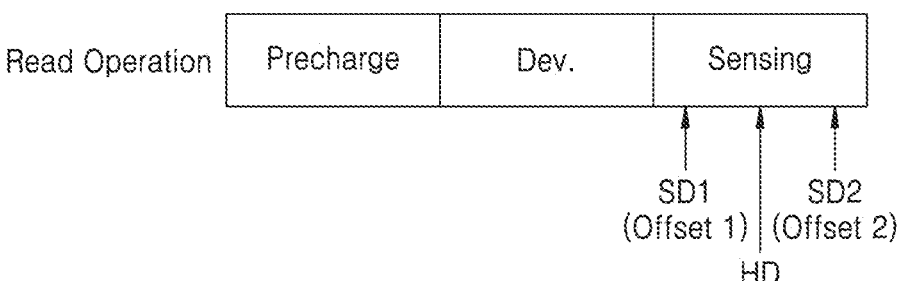

FIG. 7

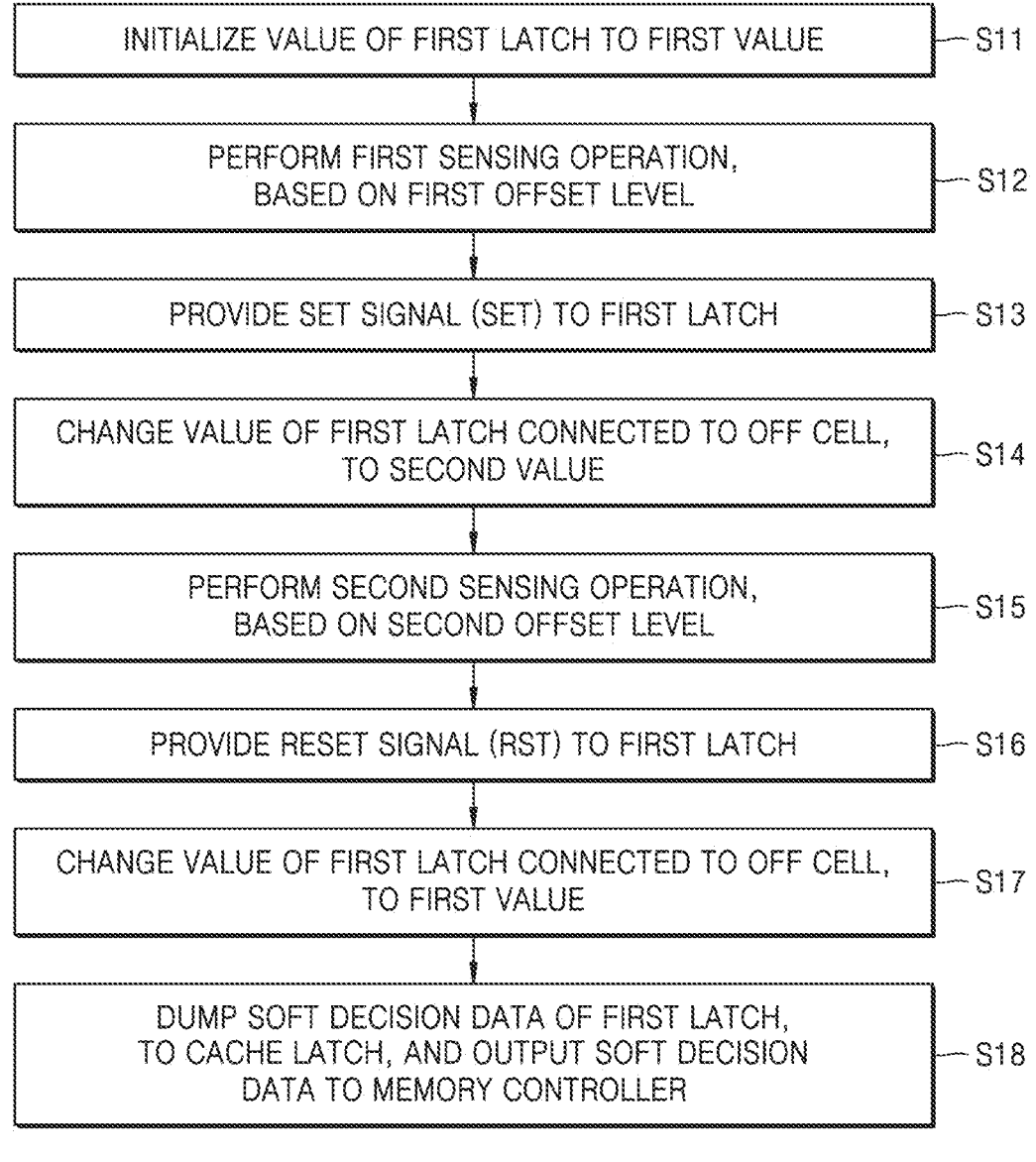

INITIALIZE VALUE OF FIRST LATCH TO FIRST VALUE — S11

PERFORM FIRST SENSING OPERATION,
BASED ON FIRST OFFSET LEVEL — S12

PROVIDE SET SIGNAL (SET) TO FIRST LATCH — S13

CHANGE VALUE OF FIRST LATCH CONNECTED TO OFF CELL,
TO SECOND VALUE — S14

PERFORM SECOND SENSING OPERATION,
BASED ON SECOND OFFSET LEVEL — S15

PROVIDE RESET SIGNAL (RST) TO FIRST LATCH — S16

CHANGE VALUE OF FIRST LATCH CONNECTED TO OFF CELL,
TO FIRST VALUE — S17

DUMP SOFT DECISION DATA OF FIRST LATCH,
TO CACHE LATCH, AND OUTPUT SOFT DECISION
DATA TO MEMORY CONTROLLER — S18

FIG. 9A
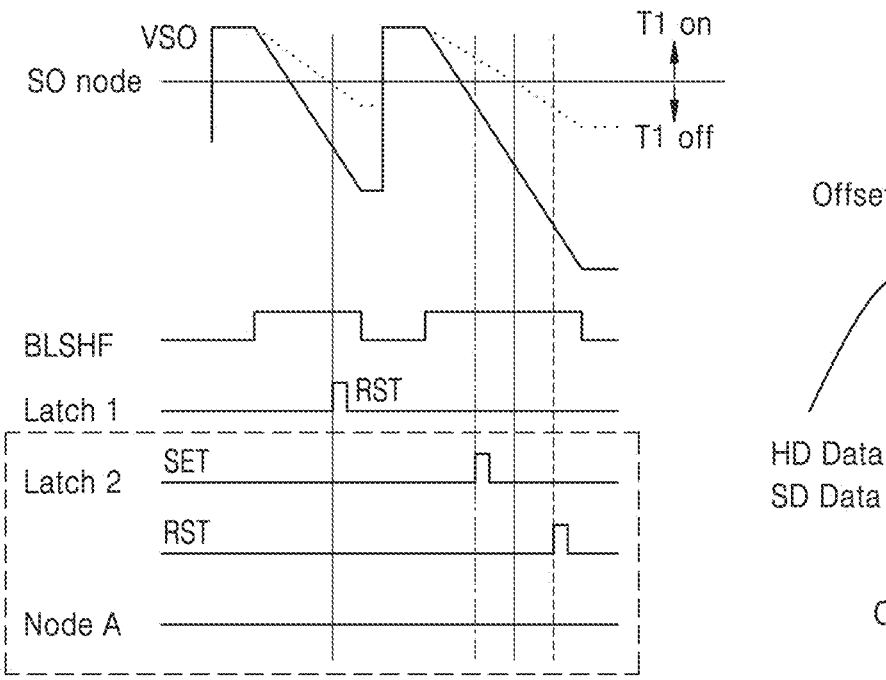
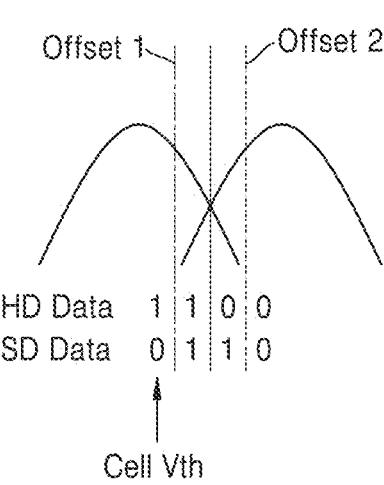

FIG. 11A
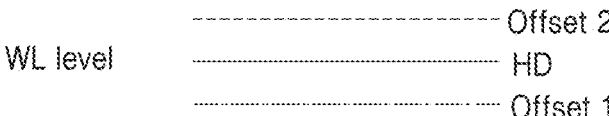
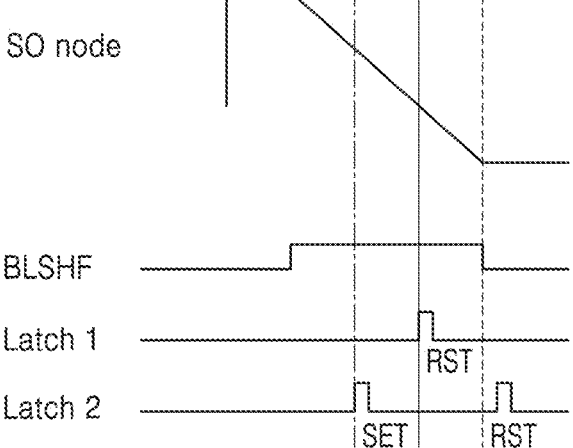
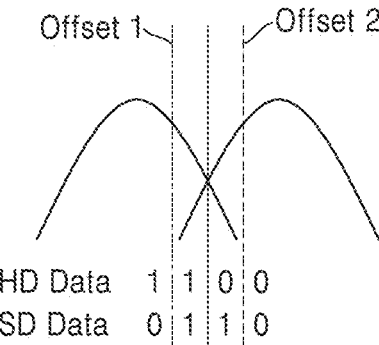

FIG. 11B
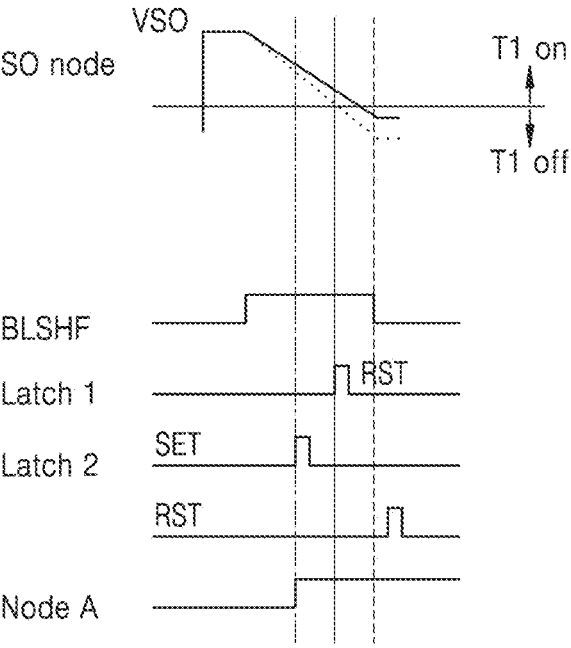
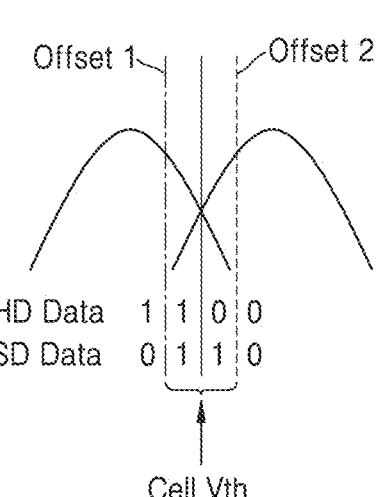

FIG. 12B
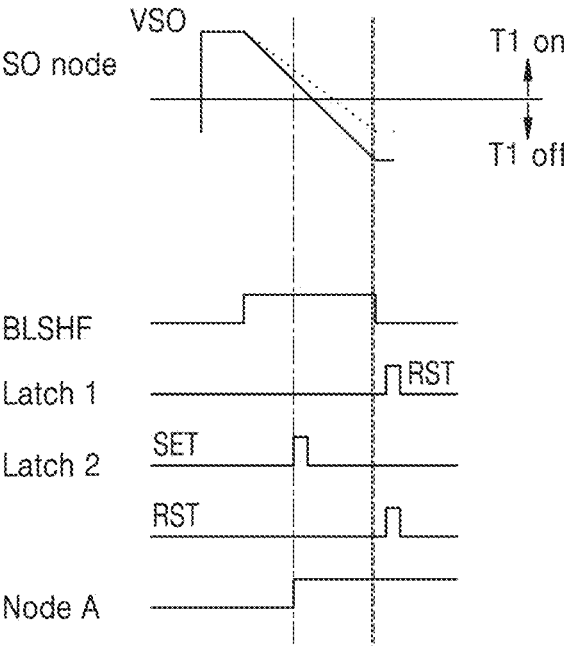
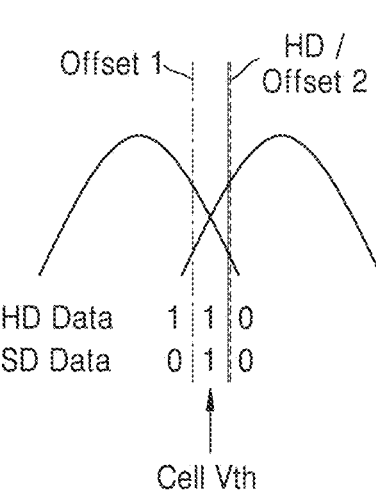

GENERATION OF SOFT DECISION DATA FOR MEMORY DEVICES

CROSS-REFERENCE TO RELATED APPLICATIONS

This application claims priority under 35 U.S.C. § 119 to Korean Patent Application Nos. 10-2023-0105135, filed on Aug. 10, 2023, and 10-2023-0137038, filed on Oct. 13, 2023, in the Korean Intellectual Property Office, the disclosures of which are incorporated by reference herein in their entireties.

BACKGROUND

A non-volatile memory device includes a plurality of memory cells that store data non-volatilely. As one example of the non-volatile memory device, a flash memory device can be used in cell phones, digital cameras, portable digital assistants (PDAs), portable computer devices, stationary computer devices, and various other types of devices.

The memory device can write or read data in various ways. As one example, in response to a read request from a memory controller, the memory device can generate hard decision data and soft decision data and output them. The hard decision data can be data that is read using a normal read level having a certain voltage level, and the soft decision data can be data that is read using an offset level having a certain offset compared to the normal read level. The memory controller can perform soft decision error correction that corrects data errors by using the hard decision data and the soft decision data from the memory device together.

In order to generate soft decision data, a plurality of latches are used to sense data based on different offset levels, and operations are performed on values determined based on the different offset levels. The time and resources used to generate the soft decision data may be high.

SUMMARY

Some aspects of this disclosure provide memory devices (and corresponding operating methods) which, in a system utilizing hard decision data and soft decision data, can reduce resources required to generate the soft decision data while improving a data read speed.

According to some implementations of this disclosure, there is provided a memory device. The memory device includes a memory cell array which includes a plurality of pages, each page including a plurality of memory cells, a control logic which controls a read operation to read hard decision data that is based on a normal read level and soft decision data that is based on first and second offset levels, from each page, and a page buffer which includes buffer units corresponding to the plurality of memory cells of the page, each buffer unit including a first latch related to sensing of the hard decision data and a second latch related to sensing of the soft decision data. The control logic controls performing a first sensing operation of storing a value determined based on the first offset level, in the second latch, at a first sensing timing, and a second sensing operation of storing a value determined based on the second offset level, in the second latch, at a second sensing timing, during a sensing duration for the page, and performs a control operation to provide any one of a set signal (SET) and a reset signal (RST) to the second latch in the first sensing operation, and provide the other one of the set signal (SET) and the reset signal (RST) to the second latch in the second sensing operation.

According to some implementations of this disclosure, there is provided an operating method of a memory device, wherein the memory device includes a page buffer, the page buffer includes buffer units corresponding to a plurality of memory cells, and each buffer unit includes a first latch related to sensing of hard decision data that is based on a normal read level and a second latch related to sensing of soft decision data that is based on first and second offset levels, the operating method includes initializing the second latch to a first value, and changing the value of the second latch, which is connected to a memory cell corresponding, based on the first offset level, to an off cell, to a second value in response to any one of a set signal (SET) and a reset signal (RST), at a first sensing timing of a sensing duration for any one page, and changing the value of the second latch, which is connected to a memory cell corresponding, based on the second offset level, to an off cell, to the first value in response to the other one of the set signal (SET) and the reset signal (RST), at a second sensing timing of the sensing duration, and after a second sensing operation is performed, outputting the soft decision data having a logic state corresponding to a value stored in the second latch or an inverted value of the value stored in the second latch.

According to some implementations of this disclosure, there is provided an operating method of a memory device, wherein the memory device includes a page buffer, the page buffer includes buffer units corresponding to a plurality of memory cells, and each buffer unit includes a first latch related to sensing of hard decision data that is based on a normal read level and a second latch related to sensing of soft decision data that is based on first and second offset levels, the operating method includes, in response to a first read command for a first page of the memory device, performing first precharge to sensing nodes of the buffer units, and storing a value determined based on the normal read level, in the first latch, during a first sensing duration after the first precharge, performing second precharge to the sensing nodes of the buffer units after the first sensing duration ends, and storing a sensing result corresponding to a first value in the second latch connected to a memory cell corresponding, based on the first offset level, to an off cell, at a first sensing timing of a second sensing duration after the second precharge, in response to any one of a set signal (SET) and a reset signal (RST), and storing a sensing result corresponding to a second value in the second latch connected to a memory cell corresponding, based on the second offset level, to an off cell, at a second sensing timing of the second sensing duration, in response to the other one of the set signal (SET) and the reset signal (RST).

BRIEF DESCRIPTION OF THE DRAWINGS

Implementations will be understood from the following detailed description taken in conjunction with the accompanying drawings in which:

FIG. 2 is a diagram illustrating an example of generating hard decision data and soft decision data.

FIG. 7 is a flowchart illustrating an operating method of a memory device according to some implementations of this disclosure.

FIG. 8 to FIGS. 10A, 10B, 10C, and 10D are diagrams illustrating examples of operations of a page buffer according to some implementations of this disclosure.

FIGS. 11A and 11B and FIGS. 12A and 12B are diagrams illustrating examples of reading soft decision data according to some implementations of this disclosure.

DETAILED DESCRIPTION

Implementations according to this disclosure will be described below in detail with reference to the attached drawings.

Figure 1:
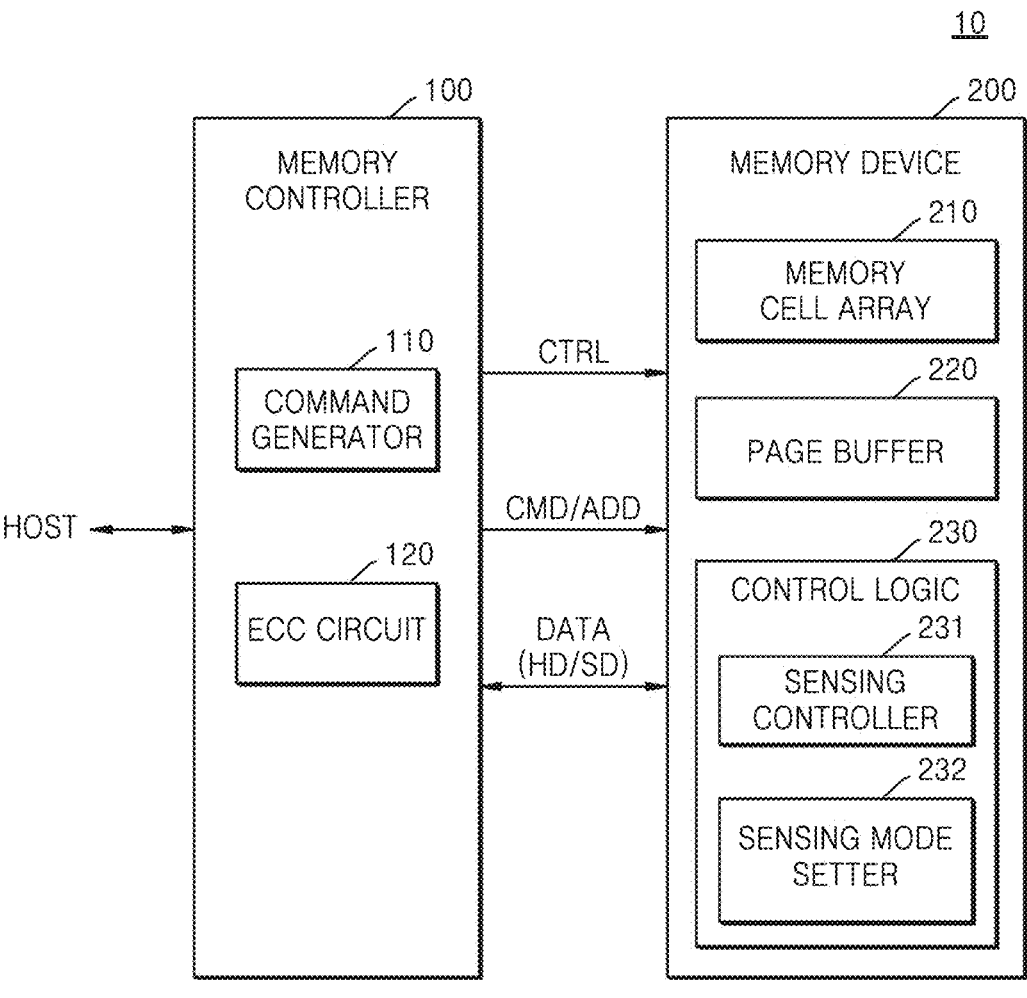
FIG. 1 is a block diagram illustrating a memory system according to some implementations of this disclosure.

FIG. 1 is a block diagram illustrating a memory system 10 according to some implementations.

Referring to FIG. 1, the memory system 10 may include a memory controller 100 and a memory device 200. The memory controller 100 may include a command generator 110 and an error correction code (ECC) circuit 120. The memory device 200 may include a memory cell array 210, a page buffer 220, and a control logic 230. The memory controller 100 may provide a command (CMD), an address (ADD), and a control signal (CTRL) to the memory device 200, and the memory controller 100 may communicate data (DATA) with the memory device 200.

The memory system 10 may communicate with a host (HOST) through various interfaces. As some examples, the memory system 10 may communicate with HOST through interfaces such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), nonvolatile memory express (NVMe), etc.

The memory device 200 may include a non-volatile memory device such as a flash memory. In some implementations, the memory system 10 is implemented by a memory embedded in or attachable to/detachable from an electronic device. For example, the memory system 10 may be implemented in various forms, such as embedded universal flash storage (UFS) memory device, embedded multi-media card (eMMC), solid state drive (SSD), UFS memory card, compact flash (CF), secure digital (SD), micro secure digital (Micro-SD), mini secure digital (Mini-SD), extreme digital (xD), memory stick, etc. Also, the memory system 10 may also be referred to as a storage device, as the memory system 10 stores data non-volatilely.

In response to a write/read request from HOST, the memory controller 100 may control the memory device 200 to read data stored in the memory device 200 or write (or program) data to the memory device 200. As one example, the memory controller 100 may have a processor (not shown), and the processor may control overall operations within the memory controller 100 and also may control memory operations for the memory device 200.

The memory cell array 210 may include a plurality of pages, and each page may include a plurality of memory cells corresponding to the units of programs and reads. For example, each page may include flash memory cells. Implementations will be described below in detail by way of examples in which the memory cells are NAND flash memory cells. However, the scope of this disclosure is not limited to NAND flash memory cells, and in some implementations, the plurality of memory cells may be resistive memory cells, such as a resistive RAM (ReRAM), a phase change RAM (PRAM), or a magnetic RAM (MRAM).

In some implementations, the memory cell array 210 may include a three-dimensional memory cell array, and the three-dimensional memory cell array may include a plurality of NAND strings, and each NAND string may include memory cells connected respectively to word lines stacked vertically on a substrate. However, the scope of this disclosure is not limited thereto, and in some implementations, the memory cell array 210 may include a two-dimensional memory cell array, and the two-dimensional memory cell array may include a plurality of NAND strings arranged along row and column directions.

Based on a read command provided from the memory controller 100 to the memory device 200, a read operation may be performed under the control of the control logic 230. The page buffer 220 may store data in units of pages that is read from the memory device 200, and may include a plurality of buffer units arranged to correspond to the memory cells. Each of the buffer units may include one or more latches. As an example, each buffer unit may include a cache latch for communicating data with an external controller, a sensing latch for sensing data dependent on a voltage of a sensing node, and one or more data latches for storing data.

As one operation example, when page data is read, hard decision data HD and soft decision data SD may be read from each memory cell. The hard decision data may correspond to data determined based on a normal read level corresponding to a normal read operation, and the soft decision data may correspond to data determined based on an offset level that has a certain offset compared to the normal read level. As one example, the offset level may include a first offset level having a negative (−) offset and a second offset level having a positive (+) offset, compared to the normal read level, and the soft decision data may be generated based on a combination of values that are determined based on the first and second offset levels. The memory controller 100 may receive the hard decision data and the soft decision data, and perform ECC decoding processing by using the received hard decision data and soft decision data. As one example, the ECC circuit 120 may perform an error correction operation such as low density parity check (LDPC).

The hard decision data and soft decision data described above may be provided to the memory controller 100 according to various policies. As one example, when an error occurs in normal data (for example, hard decision data) read from the memory device 200, the memory device 200 may generate the soft decision data, under the control of the memory controller 100. In some implementations, regardless of the result of the normal data error detection, the memory device 200 may also generate the hard decision data and the soft decision data, under the control of the memory controller 100, and provide the generated hard decision data and soft decision data to the memory controller 100.

Also, in relation to a command for generating soft decision data, the command generator 110 may generate a read command (for example, a first read command) requesting the providing of normal data, and also may further generate a command (for example, a second read command) defined separately from the first read command. In response to the first read command from the command generator 110, the memory device 200 may generate hard decision data and output the hard decision data to the memory controller 100. In contrast, in response to the second read command from the command generator 110, the memory device 200 may generate hard decision data and soft decision data together, and output the generated hard decision data and soft decision data to the memory controller 100.

As described above, the hard decision data and soft decision data may be generated and output according to various policies. In the following implementations, it will be described that, regardless of the result of error detection of normal data, the memory device 200 generates hard decision data and soft decision data together, in response to a read command from the memory controller 100, and provides the generated hard decision data and soft decision data to the memory controller 100.

A specific operation example according to some implementations will be described as follows.

In order to improve a read speed of soft decision data and reduce resource consumption, sensing operations based on a plurality of offset levels may be performed using one latch according to some implementations. Also, a read operation may include a precharge duration which performs precharge for a voltage of a sensing node, a develop duration which develops the voltage of the sensing node, and a sensing duration which determines a value of data dependent on the voltage of the sensing node. The sensing operations based on the plurality of offset levels may be performed during the same sensing duration (e.g., without performing precharging in-between the sensing operations). As one example, after a sensing operation based on any one offset level is performed, a plurality of sensing operations may be performed at different sensing timings of the same sensing duration, without a need to perform a precharge operation again for the sensing node, and soft decision data may be generated based on values determined by the sensing operations.

In some implementations, the control logic 230 may include a sensing controller 231. The sensing controller 231 may perform various control operations for generating hard decision data and soft decision data. As one example, the sensing controller 231 may control a control operation to perform sensing operations that are based on a plurality of offset levels by using one latch, and generate soft decision data dependent on the results of the sensing operations, e.g., as described above.

Moreover, as described below, according to some implementations, soft decision data may be generated based on various sensing methods. The control logic 230 may further include a sensing mode setter 232. The sensing mode setter 232 may select any one of various sensing methods through which the soft decision data may be generated, and may set the selected method as a sensing mode. However, some implementations may perform a sensing operation for generation of soft decision data according to a preset method, without a need to include the sensing mode setter 232.

In implementations, assuming that a first latch among a plurality of latches included in each buffer unit senses soft decision data, the first latch may determine, based on a first offset level, a value of data at a first sensing timing, and also may determine, based on a second offset level, a value of data at a second sensing timing. At this time, in relation to the sensing of data, a set signal SET or a reset signal RST may be provided to the first latch, and a value stored in the first latch from a memory cell with the same threshold voltage according to a signal applied to the first latch may have a complementary level. For example, when the set signal SET is provided to the first latch, a value of "1" corresponding to a logic high level may be stored in the first latch from a memory cell with a threshold voltage larger than the first offset level, whereas when the reset signal RST is provided to the first latch, a value of "0" corresponding to a logic low level may be stored in the first latch.

According to some implementations, assuming that a set signal SET is provided to the first latch at a first sensing timing, a reset signal RST may be provided to the first latch at a second sensing timing. According to the above process, assuming that a second offset level is larger than a first offset level, a value of "0" corresponding to a logic low level may be stored in the first latch from a memory cell with a threshold voltage smaller than the first offset level and larger than the second offset level. In contrast, a value of "1" corresponding to a logic high level may be stored in the first latch from a memory cell with a threshold voltage between the first offset level and the second offset level.

Accordingly, a read time of soft decision data may be reduced in that sensing operations based on different offset levels may be performed during the same sensing duration in order to generate the soft decision data. Also, a signal provided to the first latch is controlled as described above, whereby sensing operations based on a plurality of offset levels may be performed through one latch, and a result corresponding to soft decision data may be generated without performing a separate operation such as an XOR operation, so resource consumption related to generation of the soft decision data may be reduced.

In some implementations, soft decision data may be dumped to a cache latch included in each buffer unit and then be provided to the memory controller 100. The memory device 200 may include a compressor (not shown). The compressor may perform a compression operation for the soft decision data stored in the cache latch, and the compressed soft decision data may be output to the memory controller 100. The compression operation may be performed through various types of compression algorithms, such as lossy compression and non-lossy compression. As the compression is performed, soft decision data of any one page may be smaller in size than hard decision data.

FIG. 2 is a diagram illustrating an example of generating hard decision data and soft decision data.

In response to a read command from a memory controller, a memory device may generate hard decision data and soft decision data, together. As one example, the memory device may read hard decision data by using a word line voltage having a normal read level, and may read soft decision data by using word line voltages having first and second offset levels.

According to some implementations, the memory device may read soft decision data, by performing sensing operations at different sensing timings of any one sensing duration. As one example, when a sensing timing of any one sensing duration is relatively fast, a value of data may be determined based on a relatively low threshold voltage level, whereas when the sensing timing is relatively late, a value of data may be determined based on a relatively high threshold voltage level. According to some implementations, strobe signals (for example, a set signal SET and a reset signal RST) having complementary levels are provided to the latch at at least two sensing timings, whereby the soft decision data may be read using one latch.

Referring to FIGS. 1 and 2, the memory device 200 may output data determined based on a normal read level, as hard decision data HD, and output data determined based on an offset level, as soft decision data SD. The offset level may include a first offset level Offset 1 having a level as small as a first offset compared to the normal read level and a second offset level Offset 2 having a level as large as a second offset compared to the normal read level. The memory device 200 may generate soft decision data SD, based on values determined using the first offset level Offset 1 and the second offset level Offset 2. The first offset and the second offset may be the same or may be different.

As one example, hard decision data HD of a memory cell with a threshold voltage smaller than a normal read level may have a value of "1", and hard decision data HD of a memory cell with a threshold voltage larger than the normal read level may have a value of "0". Also, soft decision data SD of a memory cell with a threshold voltage smaller than a first offset level Offset 1 or larger than a second offset level Offset 2 has a value of "0", whereas soft decision data SD of a memory cell with a threshold voltage between the first offset level Offset 1 and the second offset level Offset 2 may have a value of "1". The soft decision data SD may include information indicating whether the memory cell has a strong error or a weak error. Various parameters, such as coefficients, used for error correction operations, may be calculated based on the hard decision data HD and the soft decision data SD.

A read operation performed in response to a read command may include a plurality of durations, and may include, as one example, a precharge duration, a develop duration, and a sensing duration. During the precharge duration, a sensing node may be precharged with a voltage of a certain level. Also, during the develop duration, a voltage level of the sensing node may be changed depending on data stored in a memory cell. As one example, there may be a characteristic in which the voltage level of the sensing node rapidly drops when the data is programmed at a relatively low threshold voltage whose memory cell corresponds to an on cell, whereas the voltage level of the sensing node gradually drops when the data is programmed at a relatively high threshold voltage whose memory cell corresponds to an off cell.

In some implementations, as shown in FIG. 2, hard decision data HD and soft decision data SD may be generated together, by performing a sensing operation at different timings of any one sensing duration. As one example, a value of data may be determined based on a first offset level Offset 1, according to a sensing operation performed at the earliest sensing timing of the sensing duration, and a value of data may be determined based on a normal read level, according to a sensing operation performed at a subsequent sensing timing, and a value of data may be determined based on a second offset level Offset 2, according to a sensing operation performed at the last sensing timing. Also, soft decision data SD may be generated based on the values of data determined based on the first offset level Offset 1 and the second offset level Offset 2.

In the example of FIG. 2, it has been described that the soft decision data SD of the memory cell with the threshold voltage smaller than the first offset level Offset 1 or larger than the second offset level Offset 2 has the value of "0", but implementations need not be limited to this. As one example, the soft decision data SD of the memory cell with the threshold voltage smaller than the first offset level Offset 1 or larger than the second offset level Offset 2 may be defined as having a value of "1".

Assuming that soft decision data SD of a memory cell with a threshold voltage smaller than the first offset level Offset 1 or larger than the second offset level Offset 2 corresponds to "0", a value of "1" may also be stored in a latch according to a sensing result for the memory cell. At this time, by inverting the value of "1" and dumping the soft decision data SD to a cache latch, the soft decision data SD having a value of "0" may be output from the cache latch to the memory controller.

Figure 3:
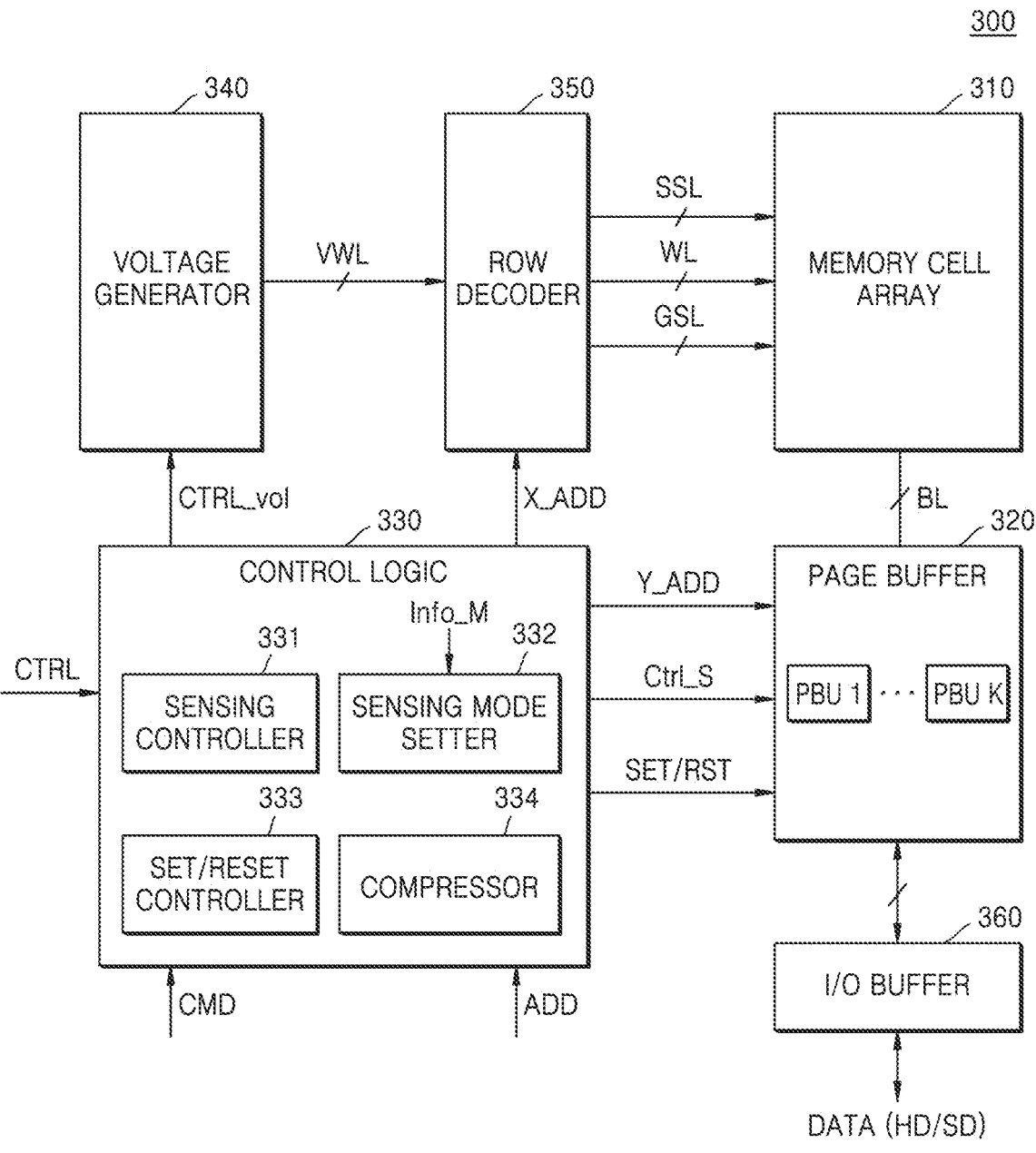
FIG. 3 is a block diagram illustrating an example of a memory device according to some implementations of this disclosure.

FIG. 3 is a block diagram illustrating an example of a memory device according to some implementations. Referring to FIG. 3, the memory device 300 may include a memory cell array 310, a page buffer 320, a control logic 330, a voltage generator 340, a row decoder 350, and an input and output buffer 360. Also, the control logic 330 may include a sensing controller 331, a sensing mode setter 332, a set/reset controller 333, and a compressor 334. The memory device 300 may be the memory device 200 of FIG. 1.

The memory cell array 310 may include a plurality of pages, and the memory cell array 310 may be connected to word lines WL, a string select line SSL, a ground select line GSL, and bit lines BL. For example, the memory cell array 310 may be connected to the row decoder 350 through the word lines WL, the string select line SSL, and the ground select line GSL, and may be connected to the page buffer 320 through the bit lines BL.

The page buffer 320 may be connected to the bit lines BL and temporarily store written data or temporarily store read data. The page buffer 320 may include a plurality of buffer units (for example, 1st to kth buffer units PBU 1 to PBU K) corresponding to a plurality of memory cells of a page. Each buffer unit may be connected to a corresponding bit line BL through a sensing node, and may include a plurality of latches.

The control logic 330 may program data to the memory cell array 310, or read data from the memory cell array 310, based on a command CMD, an address ADD, and a control signal CTRL that are received from a memory controller. Various internal control signals output from the control logic 330 may be provided to the page buffer 320, the voltage generator 340, and the row decoder 350. For example, the control logic 330 may provide a voltage control signal CTRL_vol to the voltage generator 340. In relation to program/read/erase operations, the voltage generator 340 may provide word line voltages VWL of various levels to the row decoder 350. Also, the control logic 330 may provide a row address X_ADD to the row decoder 350, and may provide a column address Y_ADD to the page buffer 320. Also, in relation to a data sensing operation, the control logic 330 may output a sensing control signal (Ctrl_S) and a set/reset signal (SET/RST) to the page buffer 320.

In some implementations, by performing control operations for a plurality of latches included in each buffer unit of the page buffer 320, the control logic 330 may control a read operation. For example, the sensing controller 331 may control sensing timings at which sensing operations are performed, to determine, based on a normal read level and/or offset levels, a value of data. Also, the control of the sensing timings of any one sensing duration described above may be performed through various methods, and the sensing mode setter 332 may set a sensing mode to perform a sensing operation according to any one method. Also, according to the above-described examples, the set/reset controller 333 may output a set signal SET and a reset signal RST to a latch that senses hard decision data HD and/or soft decision data SD. The compressor 334 may perform a compression operation on hard decision data HD and/or soft decision data SD. As one example, the compressor 334 may perform a compression operation on soft decision data SD dumped to a cache latch.

Figure 4:
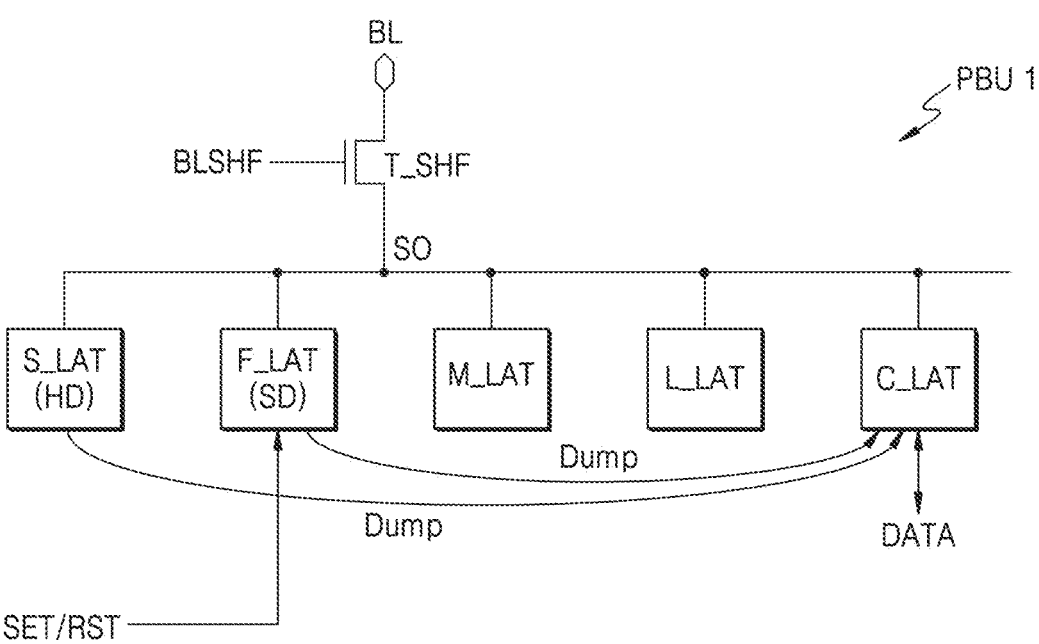
FIG. 4 is a diagram illustrating an example of a buffer unit of a page buffer of FIG. 3.

FIG. 4 is a diagram illustrating one example of a buffer unit of a page buffer of FIG. 3. FIG. 4 shows a schematic configuration of latches included in a first buffer unit PBU 1 connected to any one bit line BL. In this example, it is assumed that each memory cell may store at least two bits of data, and the buffer unit PBU includes five latches. Also, a sensing node SO of the first buffer unit PBU 1 may be connected to a bit line BL through a shut-off transistor T_SHF, and the shut-off transistor T_SHF may be controlled by a shut-off control signal BLSHF.

The first buffer unit PBU 1 may include a first latch (for example, a sensing latch S_LAT), a second latch (for example, a force latch F_LAT), a third latch (for example, a first data latch M_LAT), a fourth latch (for example, a second data latch L_LAT), and a fifth latch (for example, a cache latch C_LAT). As one example, the sensing latch S_LAT may be a latch that senses hard decision data HD. Also, in some implementations, it may be defined that soft decision data SD is sensed by the force latch F_LAT. Also, the force latch F_LAT may be further used for storing forcing information for finely changing the distribution of a threshold voltage in a data programming process. Also, the first data latch M_LAT and the second data latch L_LAT may be used for temporarily storing data to be written and read data.

A read operation may include a precharge duration, a develop duration, and a sensing duration. When the shut-off transistor T_SHF is turned on during the develop duration, the sensing node SO may be connected to a memory cell through the bit line BL, and a voltage level of the sensing node SO may vary depending on data stored in the memory cell. Also, the shut-off transistor T_SHF may be turned off for sensing a value of data during the sensing duration. However, according to some implementations of the present disclosure, when a plurality of sensing operations are performed during any one sensing duration, at least some of the sensing operations may be performed with the shut-off transistor T_SHF turned on.

The cache latch C_LAT may store data received from the outside or may output data to the outside, and data (DATA) may be dumped between the cache latch C_LAT and other latches within the first buffer unit PBU 1. As one example, hard decision data HD stored in the sensing latch S_LAT may be dumped to the cache latch C_LAT and then output to a memory controller, and soft decision data SD stored in the force latch F_LAT may be dumped to the cache latch C_LAT and then output to the memory controller.

As one operation example, soft decision data SD may have a value corresponding to a result of performing a certain operation (e.g., XOR operation) on values determined through two offset levels (first and second offset levels). According to some implementations, any one of a set signal SET and a reset signal RST may be provided to the force latch F_LAT at a first sensing timing of any one sensing duration, and the other one of the set signal SET and the reset signal RST may be provided to the force latch F_LAT at a second sensing timing.

Any one of hard decision data HD and soft decision data SD may be controlled to be first output to a memory controller according to the settings of a memory system. As one example, hard decision data HD or soft decision data SD may be set to be first output through the initial setting of a memory device, or the hard decision data HD or the soft decision data SD may be also set to be first output according to the type of a command from the memory controller.

Figure 5:
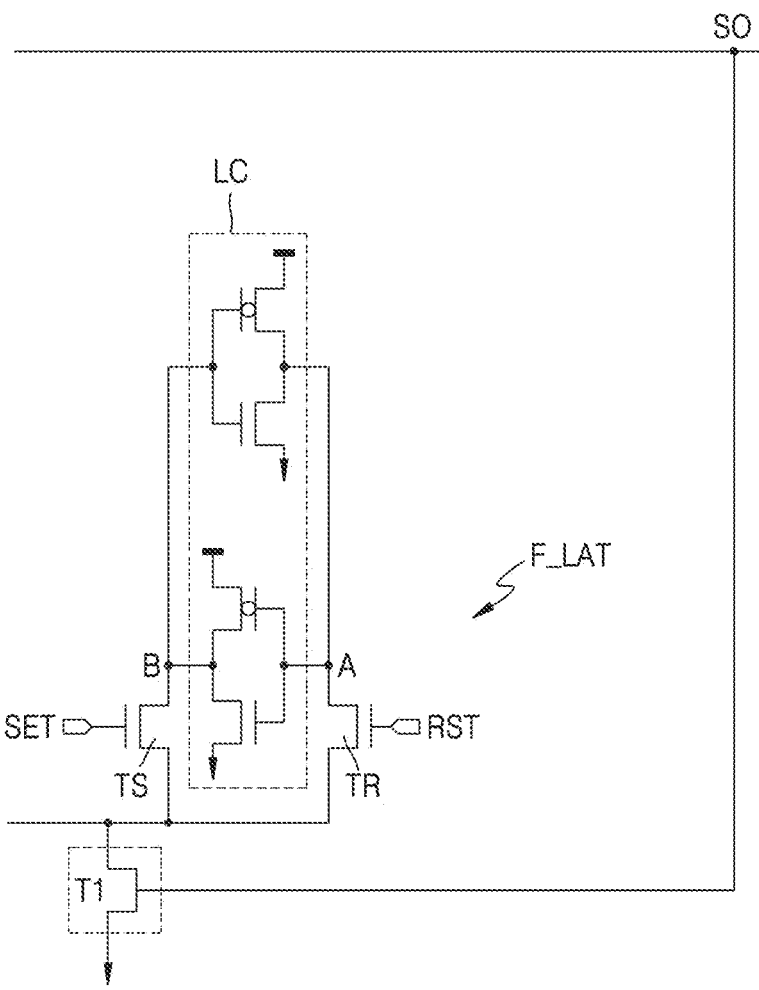
FIG. 5 is a circuit diagram illustrating an example of any of the latches shown in FIG. 4.

FIG. 5 is a circuit diagram illustrating an example of any one of the latches shown in FIG. 4. As one example, it is described that the latch of FIG. 5 is a force latch F_LAT that senses soft decision data SD, but other latches may also be implemented in the same manner as a circuit shown in FIG. 5.

Referring to FIG. 5, the force latch F_LAT may include a latch circuit LC in which inverters are implemented to be engaged with each other, and one or more transistors. Logic states of a first node A and a second node B of the latch circuit LC may have complementary levels. Assuming that the first node A corresponds to an output terminal in the force latch F_LAT, the second node B may correspond to an inverted output terminal.

A logic state of data stored in the latch circuit LC may be flipped by a voltage level provided to any one of the first node A and the second node B. For example, when the first node A is connected to the ground voltage through a first transistor T1, the logic state of data may be flipped as a voltage level of the first node A drops to the ground voltage level, whereas, when the first node A is not connected to the ground voltage, the voltage level of the first node A may be maintained.

In addition, a gate of the first transistor T1 may be connected to the sensing node SO. The first transistor T1 may be turned on or off depending on a voltage level of the sensing node SO. When data is programmed at a relatively low threshold voltage in a memory cell connected to the sensing node SO, corresponding to an on cell, the first transistor T1 may maintain a turn-off state as the voltage level of the sensing node SO rapidly drops during a develop duration. In contrast, when data is programmed at a relatively high threshold voltage in a memory cell connected to the sensing node SO, corresponding to an off cell, the first transistor T1 may be changed to a turn-on state as the voltage level of the sensing node SO gradually drops during the develop duration. Also, the force latch F_LAT may further include a set transistor TS and a reset transistor TR arranged between the latch circuit LC and the first transistor T1. A set signal SET may be provided to a gate of the set transistor TS, and a reset signal RST may be provided to a gate of the reset transistor TR.

Assuming that a voltage of the first node A is provided as an output signal of the force latch F_LAT, a voltage level of the first node A may have a value of "1" corresponding to a logic high level or a value of "0" corresponding to a logic low level through an initialization process of the force latch F_LAT. If the first transistor T1 is turned on as a memory cell connected to the sensing node SO corresponds, based on a sensing level, to an off cell, the voltage level of the first node A may have the value of "1" when the set signal SET is provided to the force latch F_LAT in a sensing operation. In contrast, in a state where the first transistor T1 is turned on, the voltage level of the first node A may have the value of "0" when the reset signal RST is provided to the force latch F_LAT in the sensing operation. Accordingly, in a first sensing operation based on a first offset level, any of the set signal SET and the reset signal RST may be provided to the force latch F_LAT, and in a second sensing operation based on a second offset level, the other one of the set signal SET and the reset signal RST may be provided to the force latch F_LAT.

Figure 6A:
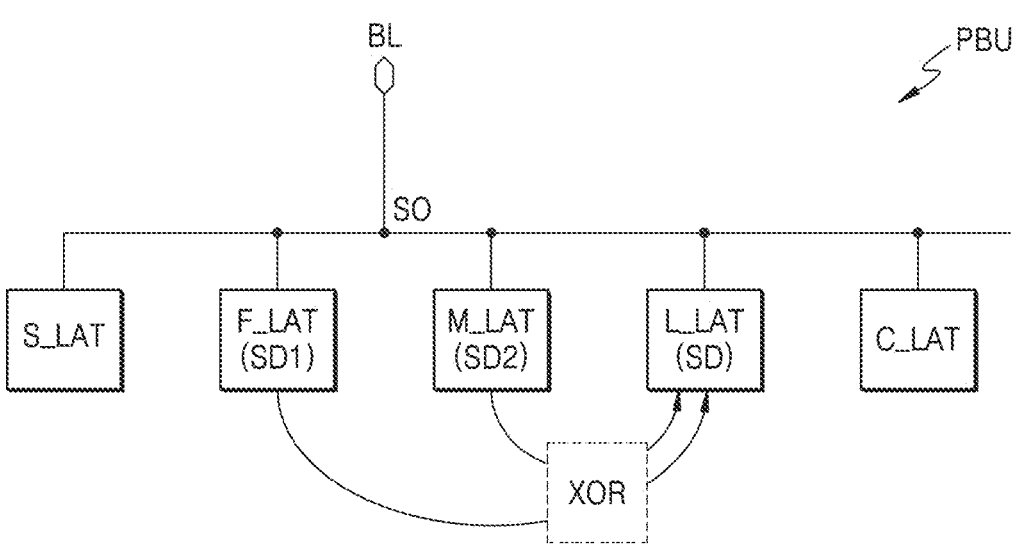
FIGS. 6A and 6B are diagrams illustrating examples of operations of a buffer unit in relation to soft decision data.
Figure 6B:
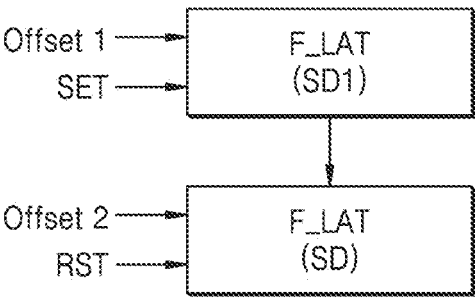

FIGS. 6A and 6B are diagrams illustrating examples of operations of a buffer unit in relation to soft decision data. FIG. 6A illustrates an example of an operation of the buffer unit using separate latches for sensing two values for soft decision data SD, and FIG. 6B illustrates an example of an operation of the buffer unit using one latch for sending two values for soft decision data SD during the same sensing duration.

Referring to FIG. 6A, a sensing operation based on a first offset level may be performed by a force latch F_LAT, and a sensing operation based on a second offset level may be performed by a first data latch M_LAT. According to the sensing operation described above, a first sensing value SD1 may be stored in the force latch F_LAT, and a second sensing value SD2 may be stored in the first data latch M_LAT. Soft decision data SD may be generated by performing an operation on the first sensing value SD1 and the second sensing value SD2. As one example, a result of performing an XOR operation on the first sensing value SD1 and the second sensing value SD2 may be stored as the soft decision data SD, in a second data latch L_LAT.

Referring to FIG. 6B, according to some implementations, a first sensing operation may be performed at a first sensing timing of a sensing duration, and a first sensing value SD1 based on a first offset level Offset 1 may be stored in a force latch F_LAT. Also, at the first sensing timing, a set signal SET may be provided to the force latch F_LAT.

Thereafter, a second sensing operation based on a second offset level Offset 2 may be performed at a second sensing timing of the sensing duration. A reset signal RST may be provided to the force latch F_LAT at the second sensing timing. According to the operation described above, a value corresponding to soft decision data SD may be stored in the force latch F_LAT. As one example, soft decision data SD having the same value (for example, a value of "0") may be read from memory cells with threshold voltages smaller than the first offset level Offset 1 or larger than the second offset level (Offset) 2). Also, soft decision data SD having the same value (e.g., a value of "1") may be read from memory cells with threshold voltages between the first offset level Offset 1 and the second offset level Offset 2.

FIG. 7 is a flowchart illustrating an operating method of a memory device according to some implementations. In the example of in FIG. 7, a first latch among a plurality of latches included in a buffer unit generates soft decision data through sensing operations at first and second sensing timings. Also, a page buffer includes a plurality of buffer units, and soft decision data read from a plurality of memory cells may be stored in a plurality of first latches included in the plurality of buffer units.

Referring to FIG. 7, before a read operation is performed, a value of a first latch may be initialized to a first value (S11). As one example, it is assumed that the first value stored in the first latch according to the initialization operation corresponds to a value of "0" corresponding to a logic low level.

The first latch may perform a first sensing operation, based on a first offset level, at a first sensing timing (S12), and a set signal SET may be provided to the first latch in a first sensing operation (S13). In this case, the value of the first latch connected, based on the first offset level, to an off cell among the plurality of first latches may be changed to a second value (S14). The second value may correspond to "1" corresponding to a logic high level.

Thereafter, the first latch may perform a second sensing operation, based on a second offset level, at a second sensing timing (S15), and a reset signal RST may be provided to the first latch in the second sensing operation (S16). In this case, the value of the first latch connected, based on the second offset level, to an off cell among the plurality of first latches may be changed to the first value (S17). The first value may correspond to "0" corresponding to the logic low level as described above.

Through the above process, the read result of soft decision data may be stored in the first latch, and the soft decision data stored in the first latch may be dumped to a cache latch and then output to a memory controller (S18). As one example, an inverting operation may or may not be applied in dumping the soft decision data of the first latch to the cache latch. Accordingly, the value stored in the first latch may be dumped to the cache latch, or the value stored in the first latch may be inverted and then dumped to the cache latch.

FIG. 8 to FIGS. 10A, 10B, 10C, and 10D are diagrams illustrating specific examples of operations of a page buffer according to some implementations.

Each buffer unit may include a plurality of latches, and it is assumed that hard decision data HD is sensed by a first latch, and soft decision data SD is sensed by a second latch. Also, each buffer unit is connected to a corresponding bit line through a shut-off transistor, and it is assumed that the shut-off transistor is turned on during a duration where a shut-off control signal BLSHF is logic high. Also, in in these examples, it is assumed that a sensing duration described in the examples of FIG. 8 to FIGS. 10A, 10B, 10C, and 10D includes the develop duration and sensing duration of the above-described implementations, in that a sensing operation may be performed while a voltage of a sensing node is developed in a state in which the shut-off transistor is turned on.

Figure 8:
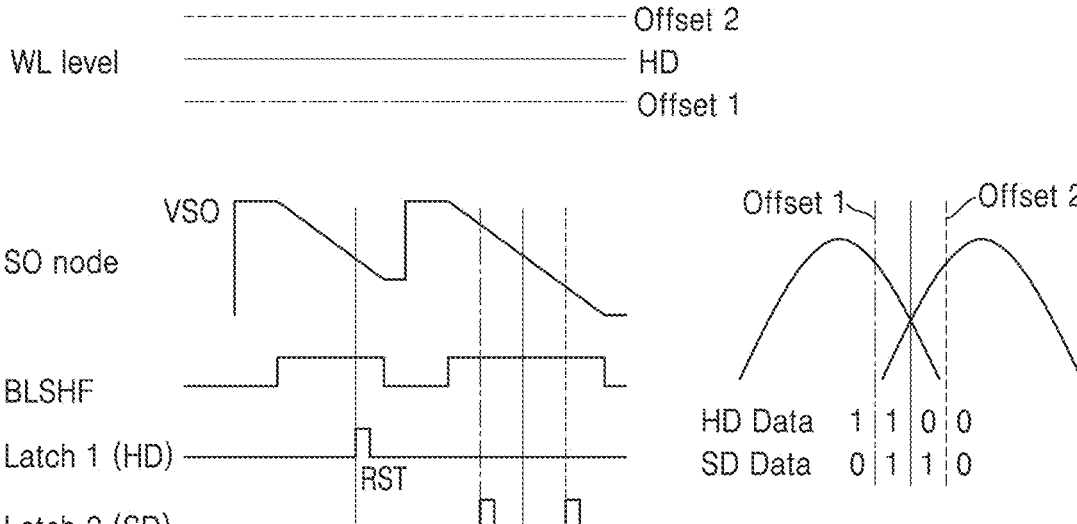

Referring to FIG. 8, in relation to a read operation, a word line voltage corresponding to a normal read level may be provided, and the normal read level may correspond to a criterion for determining hard decision data HD. Also, FIG. 8 shows that hard decision data HD and soft decision data SD are sensed during separate sensing durations. As one example, after a sensing node SO is precharged to a precharge level VSO, the hard decision data HD may be sensed during a first sensing duration. Thereafter, a precharge operation may be performed again for the sensing node SO, and the soft decision data SD may be sensed during a subsequent second sensing duration. For example, at a first sensing timing of the second sensing duration, data may be determined based on a first offset level Offset 1, and at a second sensing timing, data may be determined based on a second offset level Offset 2.

In an operation example, a first latch may be initialized to have a value of "1", and a reset signal RST may be provided to the first latch in relation to a sensing operation for hard decision data HD during a first sensing duration. In response to the reset signal RST, values stored in first latches connected to off cells, based on a normal read level, may change from the value of "1" to a value of "0". Accordingly, the hard decision data HD having the value of "1" may be read from a memory cell with a threshold voltage smaller than the normal read level, and the hard decision data HD having the value of "O" may be read from a memory cell with a threshold voltage larger than the normal read level.

Also, a second latch may be initialized to have a value of "0", and a set signal SET may be provided to the second latch at the first sensing timing of the second sensing duration, and values of second latches connected, based on a first offset level Offset 1, to the off cells may change from "0" to a value of "1". Thereafter, a reset signal RST may be provided to the second latch at the second sensing timing of the second sensing duration, and values of the second latches connected, based on a second offset level Offset 2, to the off cells may change from "1" to the value of "0". According to the above process, the soft decision data SD having a value of "0" may be read from memory cells with threshold voltages smaller than the first offset level Offset 1 or larger than the second offset level Offset 2, and the soft decision data SD having a value of "1" may be read from memory cells with threshold voltages between the first offset level Offset 1 and the second offset level Offset 2.

FIGS. 9A, 9B, 9C, and 9D show operations in which a value stored in a second latch is changed through first and second sensing operations according to a threshold voltage of a memory cell. In the following examples, sensing operations for soft decision data are described.

FIG. 9A shows a sensing operation for a first memory cell whose threshold voltage level is smaller than a first offset level Offset 1. The second latch may have a value of "0" through an initialization process. As the threshold voltage of the first memory cell is small, a voltage level of a sensing node SO connected to the first memory cell may drop rapidly in the develop process. In the develop process shown in FIG. 9A, a voltage level shown by a dotted line represents an example of a change of the voltage level when a memory cell has a threshold voltage level corresponding to a normal read level.

As the first memory cell corresponds, based on a first offset level Offset 1, to an on cell, the first transistor T1 shown in FIG. 5 may be turned off, and a value of the second latch may be maintained as a value of "0" at a first sensing timing without being changed. Also, as the first memory cell corresponds, based on a second offset level Offset 2, to an on cell, the value of the second latch may be maintained as the value of "0" at a second sensing timing, without being changed. Accordingly, assuming that the first node A of the above-described example shown in FIG. 5 corresponds to an output terminal of the second latch, soft decision data SD corresponding to the value of "0" may be read from the first memory cell.

Figure 9B:
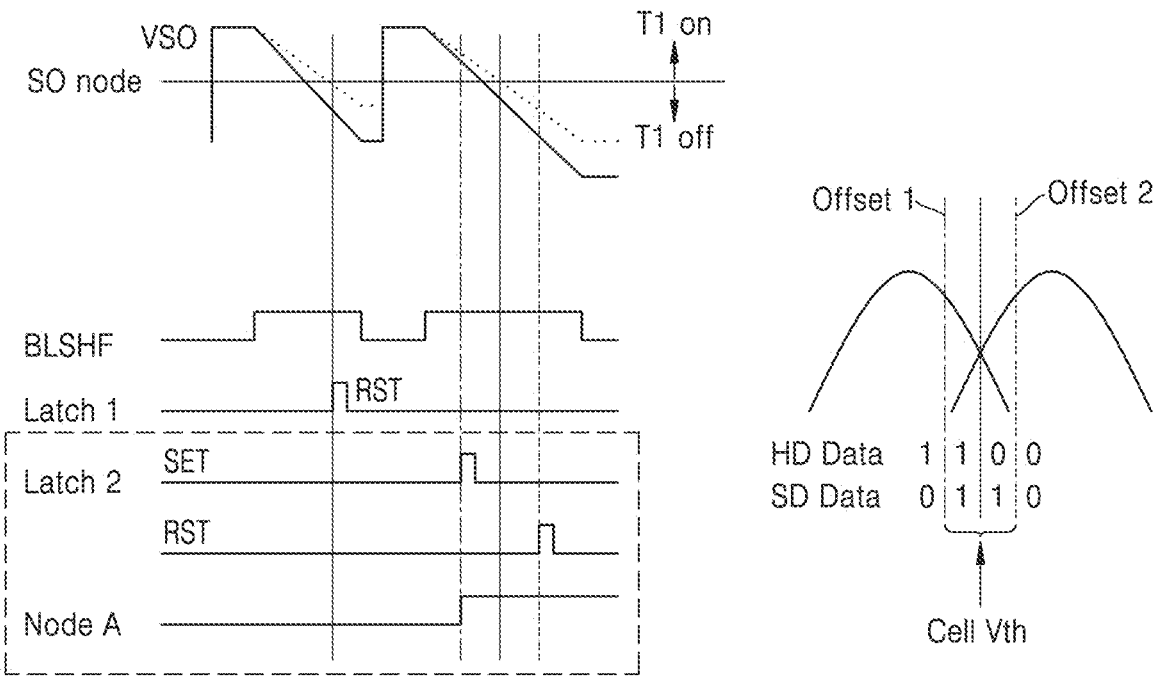

FIG. 9B shows a sensing operation for a second memory cell whose threshold voltage level has a value between a first offset level Offset 1 and a second offset level Offset 2. Referring to FIG. 9B, as the threshold voltage level of the second memory cell is higher than that of the first memory cell, a voltage level of the sensing node SO connected to the second memory cell may drop gradually in the develop process, compared to the voltage level of the sensing node SO connected to the first memory cell.

As the second memory cell corresponds, based on the first offset level Offset 1, to an off cell, the first transistor T1 shown in FIG. 5 may be turned on, and in response to a set signal SET, a value of the second latch may change from "0" to "1" at the first sensing timing. In addition, as the second memory cell corresponds, based on the second offset level Offset 2, to an on cell, the value of the second latch may be maintained as a value of "1" at the second sensing timing, without being changed. Accordingly, soft decision data SD corresponding to the value of "1" may be read from the second memory cell.

Figure 9C:
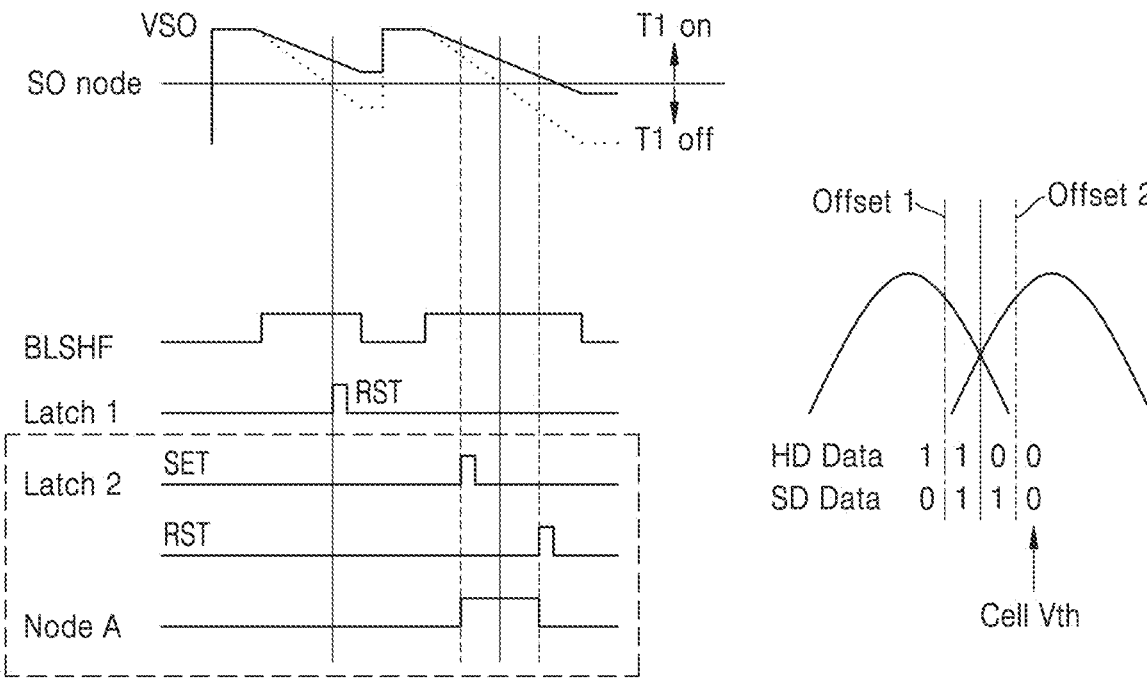

FIG. 9C shows a sensing operation for a third memory cell whose threshold voltage level is larger than a second offset level Offset 2. Referring to FIG. 9C, as the third memory cell has the threshold voltage level higher than those of the first and second memory cells, a voltage level of the sensing node SO connected to the third memory cell may drop more gradually in the develop process, compared to the voltage level of the sensing node SO connected to the first and second memory cells.

As the third memory cell corresponds, based on a first offset level Offset 1, to an off cell, a value of a second latch may change from "0" to "1" at the first sensing timing, in response to a set signal SET. Also, as the third memory cell corresponds, based on the second offset level Offset 2, to an off cell, the value of the second latch may change from "1" to "0" at the second sensing timing, in response to a reset signal RST. Accordingly, soft decision data SD corresponding to the value of "0" may be read from the third memory cell.

Figure 9D:
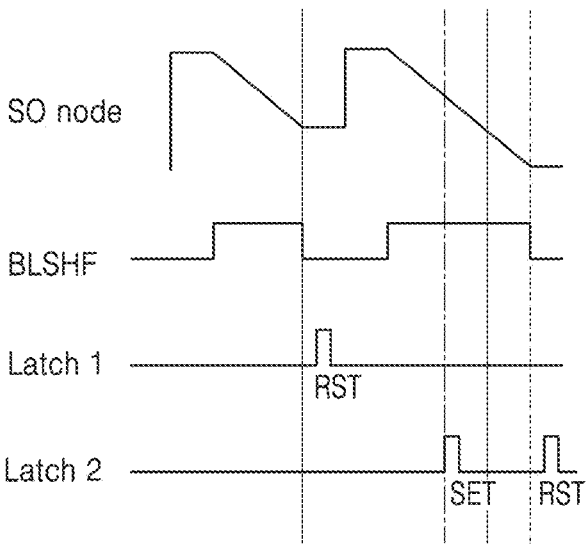

FIG. 9D shows an example related to a sensing timing. In the above-described examples of FIGS. 9A, 9B, and 9C, it is shown that a sensing timing of a first latch and the first and second sensing timings of the second latch are all performed with the shut-off transistor turned on. However, implementations need not be limited thereto. As one example, as shown in FIG. 9D, the sensing timing of the first latch may also be performed with the shut-off transistor turned off, the first sensing timing of the second latch may be performed with the shut-off transistor turned on, and the second sensing timing may be performed with the shut-off transistor turned off.

FIGS. 10A, 10B, 10C, and 10D illustrate examples in which a method of providing a set signal SET and a reset signal RST is changed compared to the examples of FIGS. 9A, 9B, 9C, and 9D. A first latch that stores hard decision data HD may have a value of "0" through an initialization process. In response to a set signal SET, the value of the first latch, which is connected to an off cell with a threshold voltage larger than a normal read level, may be changed to a value of "1". Also, an inverting operation may be performed in dumping the hard decision data HD stored in the first latch, to a cache latch. Accordingly, the hard decision data HD corresponding to the value of "1" may be read from the off cell with the threshold voltage larger than the normal read level.

Figure 10A:
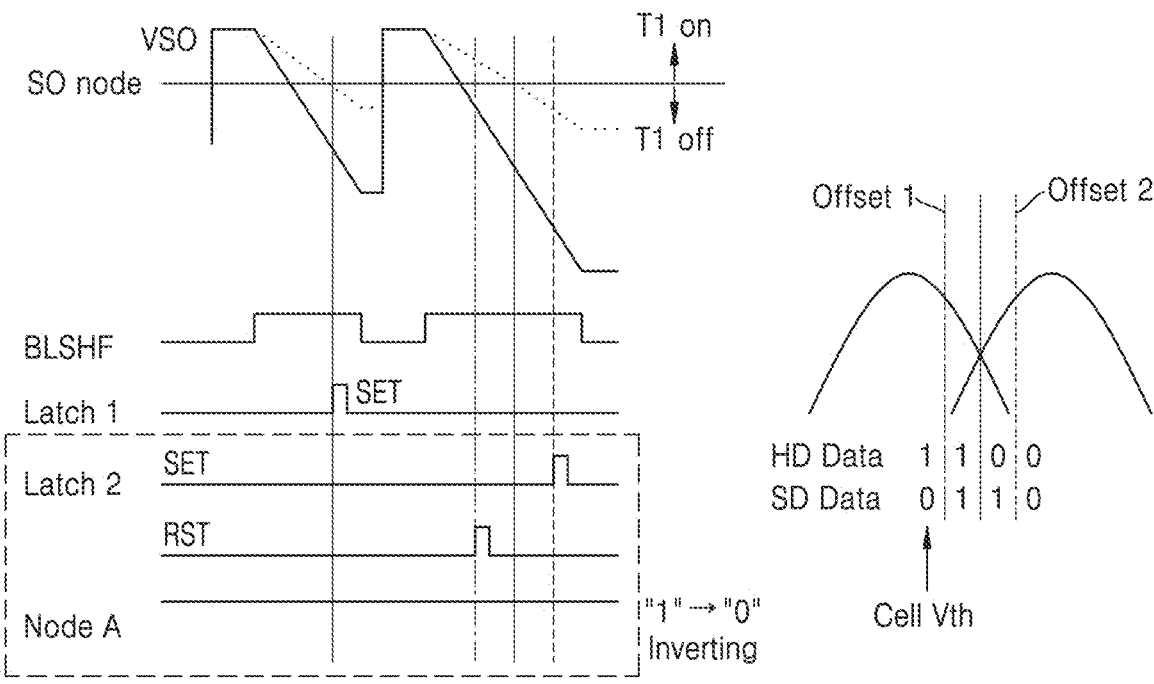

A second latch may have a value of "1" through an initialization process. Also, as shown in FIG. 10A, a first memory cell whose threshold voltage level is smaller than a first offset level Offset 1 may correspond, based on a first offset level Offset 1, to an on cell. Accordingly, the value of the second latch may be maintained as the value of "1" at a first sensing timing, without being changed. Also, as the first memory cell corresponds, based on a second offset level Offset 2, to the on cell, the value of the second latch may be maintained as the value of "1" at a second sensing timing, without being changed. Also, an inverting operation may be performed in dumping soft decision data SD stored in the second latch, to a cache latch. Accordingly, the soft decision data SD corresponding to a value of "0" may be read from the first memory cell.

Figure 10B:
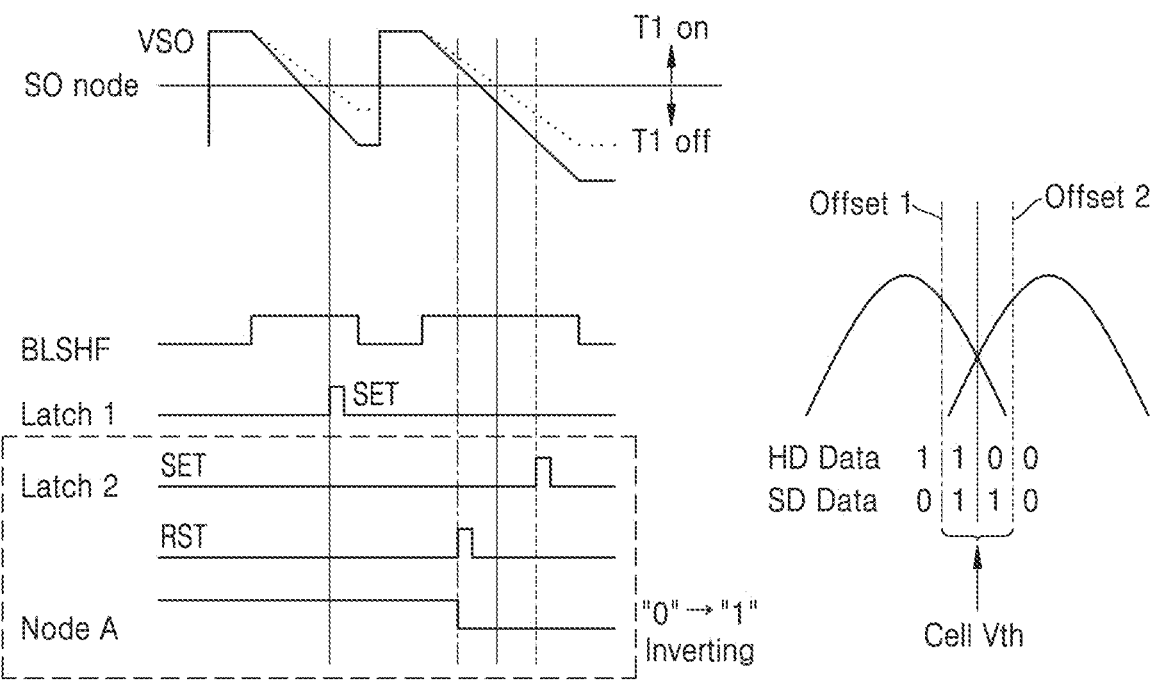

FIG. 10B shows a sensing operation for a second memory cell whose threshold voltage level has a value between a first offset level Offset 1 and a second offset level Offset 2. As the second memory cell corresponds, based on the first offset level Offset 1, to an off cell, a value of a second latch may change from "1" to "0" at a first sensing timing, in response to a reset signal RST. As the second memory cell corresponds, based on the second offset level Offset 2, to an on cell, the value of the second latch may be maintained as the value of "0" at a second sensing timing, without being changed. Also, an inverting operation may be performed in dumping soft decision data SD stored in the second latch, to a cache latch. Accordingly, the soft decision data SD corresponding to a value of "1" may be read from the second memory cell.

Figure 10C:
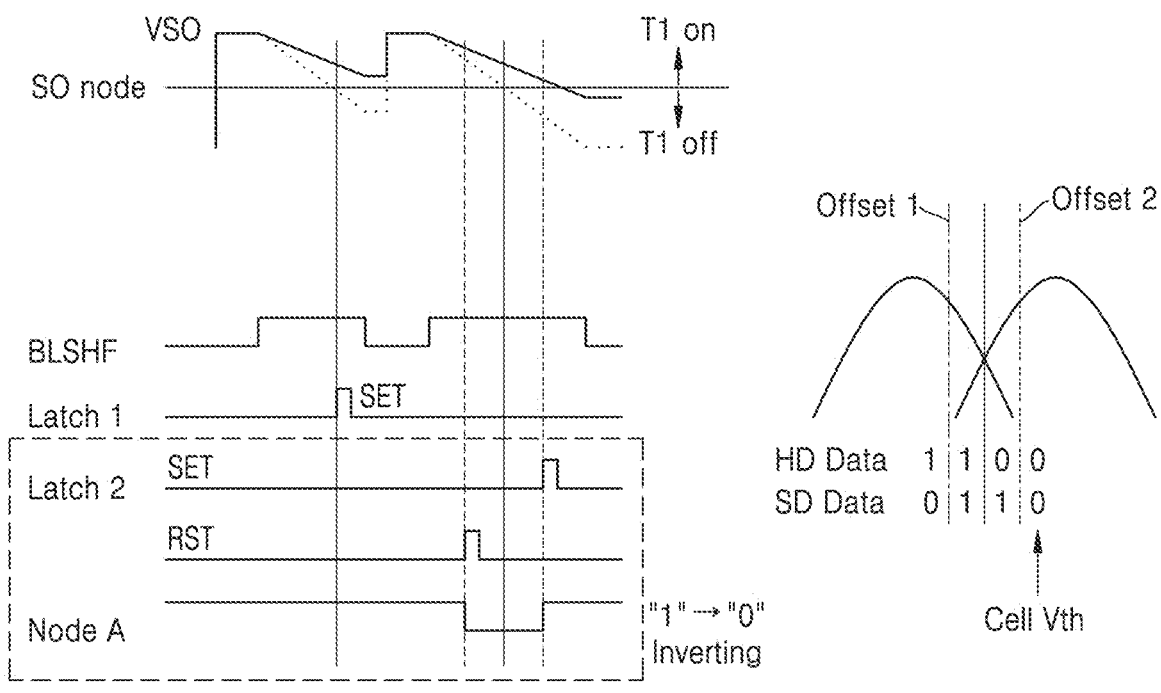

FIG. 10C shows a sensing operation for a third memory cell whose threshold voltage level is larger than a second offset level Offset 2. As the third memory cell corresponds, based on a first offset level Offset 1, to an off cell, a value of a second latch may change from "1" to "O" at a first sensing timing, in response to a reset signal RST. Also, as the third memory cell corresponds, based on a second offset level Offset 2, to an off cell, the value of the second latch may change from "0" to "1" at a second sensing timing, in response to a set signal SET. Also, an inverting operation may be performed in dumping soft decision data SD stored in the second latch, to a cache latch. Accordingly, the soft decision data SD corresponding to the value of "0" may be read from the second memory cell.

Figure 10D:
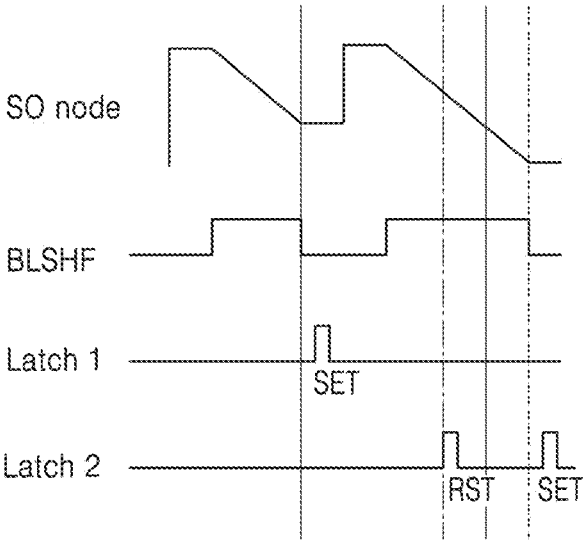

FIG. 10D shows that at least one sensing operation can be performed with a shut-off transistor turned off, similar to the example of FIG. 9D described above. As one example, a sensing timing of a first latch may be performed with the shut-off transistor turned off, and a first sensing timing of a second latch may be performed with the shut-off transistor turned on, and a second sensing timing of the second latch may be performed with the shut-off transistor turned off.

According to the implementations described above, the operations of performing a sensing operation, based on a plurality of offset levels, by using any one latch, and generating soft decision data SD through the result of the sensing operation, may be performed through initialization operations, and set/reset control, of various methods for latches.

FIGS. 11A and 11B and FIGS. 12A and 12B are diagrams illustrating examples of reading soft decision data according to some implementations.

Referring to FIGS. 11A and 11B, a word line voltage corresponding to a normal read level related to the generation of hard decision data HD may be provided to word lines of memory cells where a read operation is performed, and the hard decision data HD and the soft decision data SD may be generated together during any one sensing duration. For example, at a first sensing timing of the sensing duration, a value of data may be determined based on a first offset level Offset 1, and at a second sensing timing, a value of data may be determined based on a normal read level, and at a third sensing timing, a value of data may be determined based on a second offset level Offset 2. At this time, the value determined based on the normal read level at the second sensing timing may correspond to the hard decision data HD. In the example of FIGS. 11A and 11B, it is illustrated that the first and second sensing timings are performed with a shut-off transistor turned on, and the third sensing timing is performed with the shut-off transistor turned off, but implementations need not be limited thereto, and sensing operations may be performed at various time points. For example, the third sensing timing may also be performed with the shut-off transistor turned on.

Referring to FIG. 11A, a first latch may be initialized to a value of "1" through an initialization process. In response to a reset signal RST, the first latch, which is connected to memory cells corresponding, based on a normal read level, to off cells, may be changed to a value of "0" at a second sensing timing. Accordingly, hard decision data HD having the value of "1" may be read from on cells, and the hard decision data HD having the value of "0" may be read from the off cells.

A second latch that senses soft decision data SD may be initialized to a value of "0", and a set signal SET may be provided to the second latch at a first sensing timing. At this time, the second latch, which is connected to memory cells corresponding, based on a first offset level Offset 1, to on cells, may maintain the value of "0". In contrast, the second latch, which is connected to memory cells corresponding, based on the first offset level Offset 1, to off cells, may be changed to a value of "1".

Thereafter, a reset signal RST may be provided to the second latch at a third sensing timing. At this time, the second latch, which is connected to the memory cells corresponding, based on a second offset level Offset 2, to on cells, maintains the value of "1", whereas the value of the second latch, which is connected to the memory cells corresponding, based on the second offset level Offset 2, to off cells, may be changed to "0". Accordingly, the soft decision data SD corresponding to the value of "0" may be read from memory cells with threshold voltage levels smaller than the first offset level Offset 1 or larger than the second offset level Offset 2.

FIG. 11B shows a value stored in a second latch when a threshold voltage of a memory cell has a level between a first offset level Offset 1 and a second offset level Offset 2. Referring to FIG. 11B, the second latch that senses soft decision data SD may be initialized to a value of "0". As the memory cell corresponds, based on the first offset level Offset 1, to an off cell at a first sensing timing, the value of the second latch may be changed to a value of "1" in response to a set signal SET.

Thereafter, at a third sensing timing, a reset signal RST may be provided to the second latch. At this time, as the memory cell corresponds, based on the second offset level Offset 2, to an on cell at the third sensing timing, the value of the second latch may be maintained as the value of "1". Accordingly, the soft decision data SD corresponding to the value of "1" may be read from the memory cell with the threshold voltage level between the first offset level Offset 1 and the second offset level Offset 2.

According to the example shown in FIGS. 11A and 11B described above, there is the influence of noise in that a sensing operation for hard decision data HD is performed with a bit line and a sensing node electrically connected, whereas a read speed may be improved in that the hard decision data HD and soft decision data SD may be read during one sensing duration together.

Figure 12A:
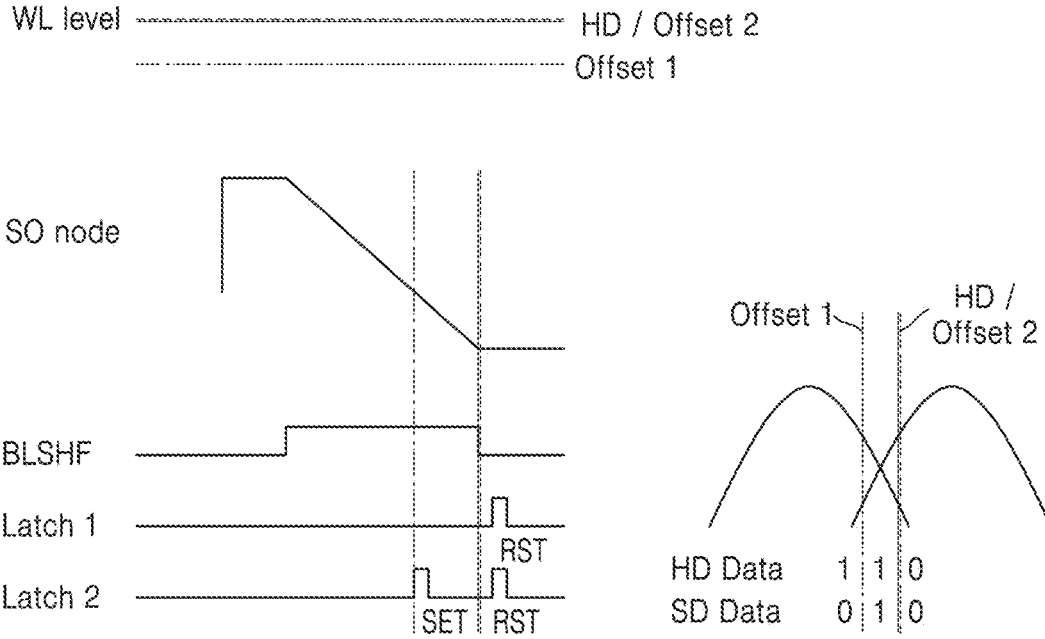

In FIGS. 12A and 12B, a description is provided for an example in which a sensing operation for the hard decision data HD is performed with a bit line and a sensing node electrically disconnected, and the amount of information of the soft decision data SD is reduced.

Referring to FIGS. 12A and 12B, a word line voltage higher by a certain level than the normal read level of the above-described examples may be provided to word lines of memory cells in which a read operation is performed. Accordingly, a criterion of a threshold voltage level that determines a value of the hard decision data HD may increase. Assuming that the criterion that determines the value of the hard decision data HD is a first threshold voltage level, the hard decision data HD having a value of "O" may be read from a memory cell with a threshold voltage larger than the first threshold voltage level. The first threshold voltage level may have an arbitrary level. In some implementations, the first threshold voltage level may have a level corresponding to a second offset level Offset 2 of the above-described examples.

Also, in the example of FIG. 12A, the hard decision data HD and the soft decision data SD may be generated together during the same sensing duration. For example, in relation to reading the soft decision data SD, a value of data may be determined based on a first offset level Offset 1 at a first sensing timing of the sensing duration, and a value of data may be determined based on a second offset level Offset 2 at a second sensing timing. As one example, the second sensing timing may correspond to timing after a shut-off transistor is turned off. In the example of FIG. 12A, it is shown that the sensing operation by the first latch and the sensing operation by the second latch are performed simultaneously at the second sensing timing, but implementations need not be limited thereto. For example, the sensing operation by the first latch and the sensing operation by the second latch may also be performed at different timings after the shut-off transistor is turned off.

A first latch may be initialized to a value of "1" through an initialization process. In response to a reset signal RST, the first latch, which is connected to memory cells corresponding, based on a first threshold voltage level, to off cells, may be changed to a value of "0" at a second sensing timing. Accordingly, the hard decision data HD having the value of "1" may be read from on cells, and the hard decision data HD having the value of "O" may be read from the off cells.

A second latch that senses the soft decision data SD may be initialized to a value of "0", and a set signal SET may be provided to the second latch at a first sensing timing. At this time, the second latch, which is connected to memory cells corresponding, based on a first offset level Offset 1, to off cells, may be changed to a value of "1".

Thereafter, a reset signal RST may be provided to the second latch at a second sensing timing. The value of the second latch, which is connected to memory cells corresponding, based on a second offset level Offset 2, to off cells, among second latches whose values have been previously changed to the value of "1", may be changed to "0". Accordingly, the soft decision data SD corresponding to the value of "O" may be read from memory cells with threshold voltage levels smaller than the first offset level Offset 1 or larger than the second offset level Offset 2.

FIG. 12B shows that a value stored in a second latch when a threshold voltage of a memory cell has a level between a first offset level Offset 1 and a second offset level Offset 2. Referring to FIG. 12B, the second latch that senses soft decision data SD may be initialized to a value of "0". As the memory cell corresponds, based on the first offset level Offset 1, to an off cell at a first sensing timing, the value of the second latch may be changed to a value of "1" in response to a set signal SET. Thereafter, at a second sensing timing, a reset signal RST may be provided to the second latch. As the memory cell corresponds, based on the second offset level Offset 2, to an on cell at the second sensing timing, the value of the second latch may be maintained as the value of "1".

According to the example shown in FIGS. 12A and 12B, the influence of noise may be reduced in the sensing of hard decision data HD in that a sensing operation for the hard decision data HD is performed with a bit line and a sensing node electrically disconnected, and also a read speed may be improved in that the hard decision data HD and the soft decision data SD may be read during one sensing duration together.

Figure 13:
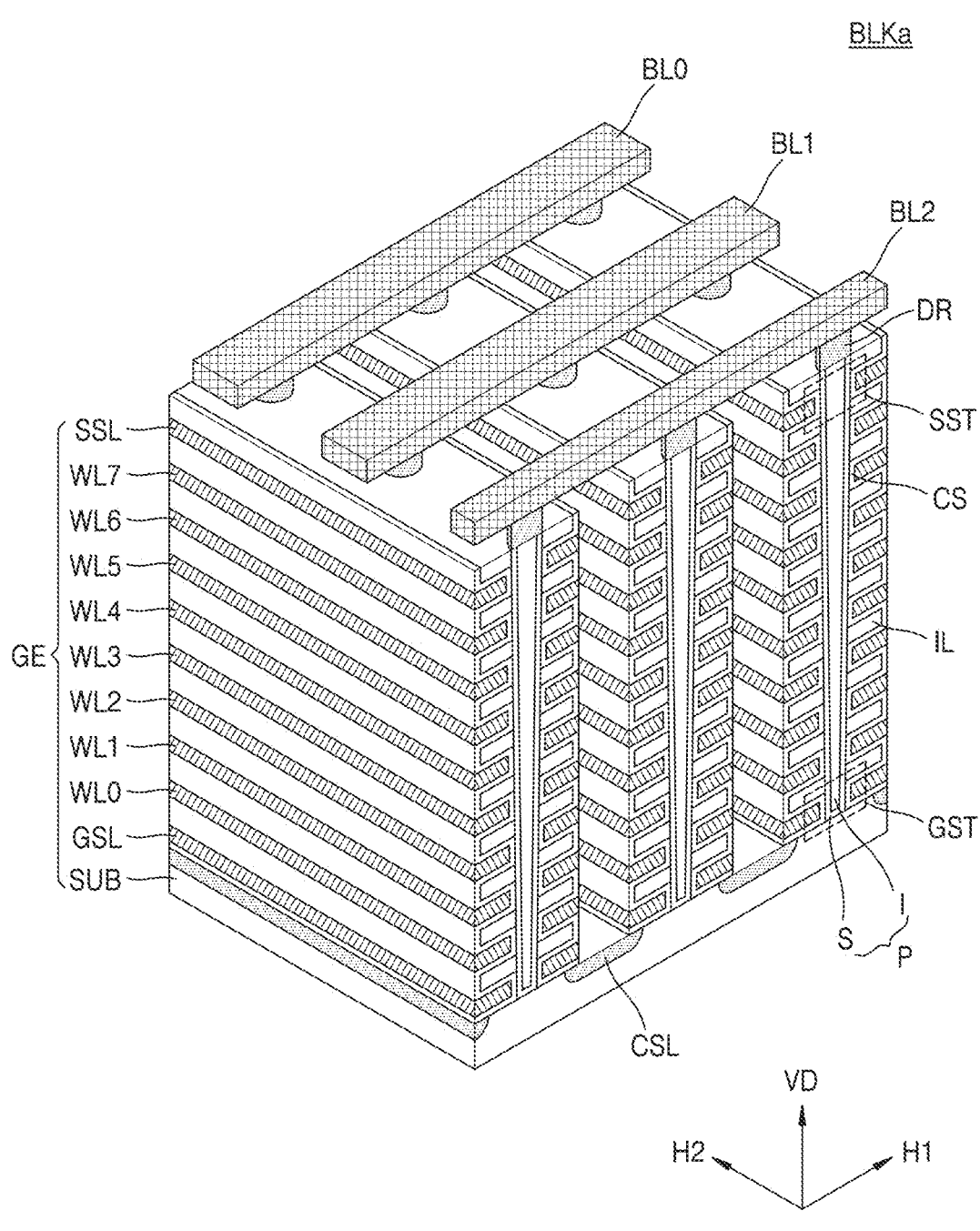
FIG. 13 is a perspective view illustrating a memory block according to some implementations of this disclosure.

FIG. 13 is a perspective view illustrating a memory block BLKa according to some implementations.

Referring to FIG. 13, the memory block BLKa may correspond to any one of a plurality of memory blocks included in the memory cell array 210 of FIG. 1. The memory block BLKa is formed in a vertical direction VD with respect to a substrate SUB having a first conductivity type (e.g., p type). In some implementations, a common source line CSL doped with impurities of a second conductivity type (e.g., n-type) may be provided on the substrate SUB. In some implementations, the substrate SUB may be implemented by polysilicon, and a plate-shaped common source line CSL may also be arranged on the substrate SUB. A plurality of insulating films IL extending along a second direction H2 are sequentially provided on the substrate SUB along the vertical direction VD, and the plurality of insulating films IL are spaced apart by a specific distance along the vertical direction VD. For example, the plurality of insulating films IL may include an insulating material such as a silicon oxide.

A plurality of pillars P sequentially arranged along a first direction H1 and penetrating the plurality of insulating films IL along the vertical direction VD are provided on the substrate SUB. For example, the plurality of pillars P may penetrate the plurality of insulating films IL and contact the substrate SUB. Specifically, a surface layer S of each pillar P may include a silicon material of a first type and may function as a channel region. Accordingly, the pillar P may be referred to as a vertical channel structure. An inner layer I of each pillar P may include an insulating material such as a silicon oxide, or an air gap.

A charge storage layer CS is provided along exposed surfaces of the insulating films IL, the pillars P, and the substrate SUB. The charge storage layer CS may include a gate insulating layer, a charge trap layer, and a blocking insulating layer. For example, the charge storage layer CS may have an oxide-nitride-oxide ONO structure. Also, a gate electrode GE, such as a ground select line GSL, a string select line SSL, and word lines WL0 to WL7, is provided on an exposed surface of the charge storage layer CS. Drains DR are provided on the plurality of pillars P, respectively. For example, the drains DR may include a silicon material doped with impurities of a second conductivity type. Bit lines BL0 to BL2 arranged to extend in the first direction H1 and spaced apart by a specific distance along the second direction H2 are provided on the drains DR.

Figure 14:
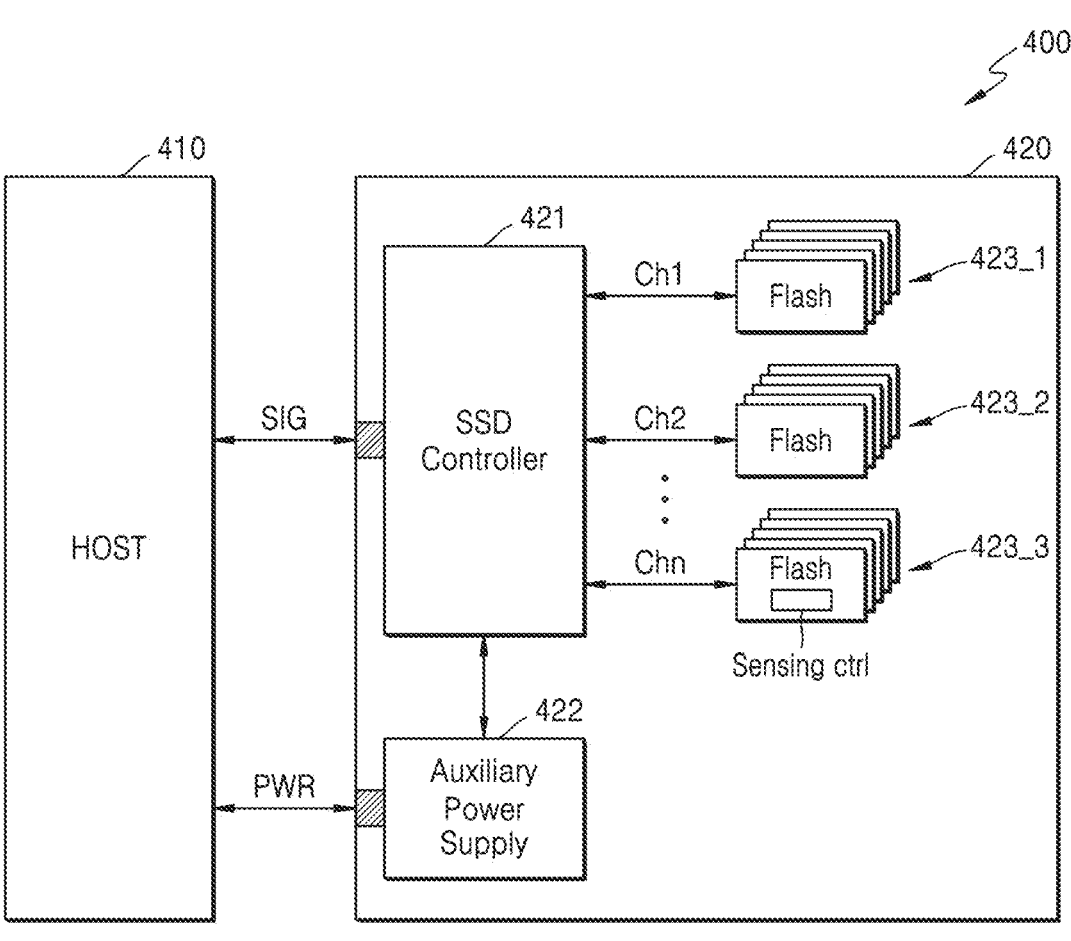
FIG. 14 is a block diagram illustrating an example of applying, to a solid state drive (SSD) system, a memory device according to some implementations of this disclosure.

FIG. 14 is a block diagram illustrating an example of applying to an SSD system 400 a memory device according to some implementations.

Referring to FIG. 14, the SSD system 400 may include a host 410 and an SSD 420. The SSD 420 exchanges a signal SIG with the host 410 through a signal connector, and receives power PWR through a power connector. The SSD 420 may include an SSD controller 421, an auxiliary power supply 422, and memory devices 423_1 to 423_3. The memory devices 423_1 to 423_3 each may be implemented using the implementations described above with reference to FIGS. 1 to 13.

That is, the SSD controller 421 may correspond to the memory controller described in the above-described implementations, and the memory devices 423_1 to 423_3 may correspond to the memory devices of the above-described implementations, and hard decision data and soft decision data may be transmitted and received between the SSD controller 421 and the memory devices 423_1 to 423_3. The memory devices 423_1 to 423_3 each may include a sensing controller, and the sensing controller may sense the soft decision data by using any one latch according to the above-described implementations, and strobe signals (for example, a set signal and a reset signal) provided to a latch at a plurality of sensing timings may have mutually complementary levels.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While some implementations have been particularly shown and described with reference to examples thereof, it will be understood that various changes in form and details may be made therein without departing from the spirit and scope of the following claims.

What is claimed is:

1. A memory device comprising:
a memory cell array comprising a plurality of pages, each page of the plurality of pages comprising a plurality of memory cells;
control logic configured to control a read operation to read, from the plurality of pages, hard decision data that is based on a normal read level and soft decision data that is based on first and second offset levels; and
a page buffer comprising buffer units for the plurality of pages, each buffer unit comprising a first latch used for sensing of the hard decision data and a second latch used for sensing of the soft decision data,
wherein the control logic is configured to control the read operation to read the soft decision data from a first page of the plurality of pages by:
controlling a first sensing operation at a first sensing timing during a sensing duration for the first page, and controlling a second sensing operation at a second sensing timing during the sensing duration,
wherein controlling the first sensing operation comprises providing a set signal or a reset signal to the second latch of a buffer unit of the buffer units, to store a value based on the first offset level in the second latch, and
wherein controlling the second sensing operation comprises
providing the other of the set signal or the reset signal to the second latch of the buffer unit, to store a value based on the second offset level in the second latch.

2. The memory device of claim 1, wherein the control logic is configured to, after the second sensing operation is performed, cause output of a value stored in the second latch or an inverted value of the value stored in the second latch as the soft decision data to a memory controller.

3. The memory device of claim 2,
wherein a first logic state of the soft decision data corresponds to memory cells with threshold voltages smaller than the first offset level or larger than the second offset level, and a second logic state of the soft decision data corresponds to memory cells with threshold voltages between the first offset level and the second offset level.

4. The memory device of claim 1,
wherein the control logic is configured to control a third sensing operation at a third sensing timing during the sensing duration,
wherein the third sensing operation comprises storing a value based on the normal read level in the first latch of the buffer unit, and
wherein the third sensing timing is later than the first sensing timing and is earlier than the second sensing timing.

5. The memory device of claim 1,
wherein the control logic is configured to control a third sensing operation at a same time as the second sensing timing,
wherein the third sensing operation comprises storing a value based on the normal read level in the first latch of the buffer unit, and
wherein the normal read level and the second offset level are equal to one another.

6. The memory device of claim 1,
wherein the sensing duration for the first page is a second sensing duration, wherein a first sensing duration is after a first precharge of a voltage of a sensing node of the buffer unit, and wherein the second sensing duration is after a second precharge of the voltage of the sensing node, the second precharge after the first sensing duration, and
wherein the control logic is configured to:
control a third sensing operation during the first sensing duration, the third sensing operation comprising storing, in the first latch of the buffer unit, a value based on the normal read level.

7. The memory device of claim 6,
wherein the buffer unit is connected to a corresponding bit line through a shut-off transistor,
wherein the third sensing operation is performed with the shut-off transistor turned off, and
wherein at least one of the first sensing operation or the second sensing operation is performed with the shut-off transistor turned on.

8. The memory device of claim 1, wherein the second latch of the buffer unit comprises:
a first transistor comprising a gate connected to a sensing node of the buffer unit;
a set transistor connected between the first transistor and an output terminal of the second latch, the set transistor controlled by the set signal; and
a reset transistor connected between the first transistor and an inverted output terminal of the second latch, the reset transistor controlled by the reset signal,
wherein, when the first transistor is turned on, a voltage level of the output terminal changes in response to at least one of the set signal or the reset signal.

9. The memory device of claim 8,
wherein the second latch is configured such that, in a state in which a value of the second latch is initialized to a first value, and in which the second latch is connected to an off memory cell based on the first offset level, the value of the second latch changes to a second value in response to the set signal in the first sensing operation.

10. The memory device of claim 9,
wherein the second latch is configured such that, in a state in which the second latch is connected to an off memory cell based on the second offset level, the value of the second latch changes to the first value in response to the reset signal in the second sensing operation.

11. A method of operating a memory device, wherein the memory device comprises a page buffer, the page buffer comprising buffer units for a plurality of memory cells, each buffer unit of the buffer units comprising a first latch for sensing hard decision data that is based on a normal read level and a second latch for sensing soft decision data that is based on first and second offset levels, wherein the method comprises:

initializing a value stored in the second latch of a buffer unit of the buffer units to a first value;

changing the value stored in the second latch to a second value in response to a set signal or a reset signal at a first sensing timing of a sensing duration for a page of the memory device, wherein the second latch is connected to an off memory cell based on the first offset level;

changing the value stored in the second latch to the first value in response to the other one of the set signal or the reset signal at a second sensing timing of the sensing duration, wherein the second latch is connected to an off memory cell based on the second offset level; and after changing the value stored in the second latch to the first value, outputting the soft decision data, the soft decision data having a logic state corresponding to the value stored in the second latch or an inverted value of the value stored in the second latch.

12. The method of claim 11, wherein a first logic state of the soft decision data corresponds to memory cells with threshold voltages smaller than the first offset level or larger than the second offset level, and a second logic state of the soft decision data corresponds to memory cells with threshold voltages between the first offset level and the second offset level.

13. The method of claim 11, comprising:

at a third sensing timing of the sensing duration, storing a value based on the normal read level in the first latch, wherein the hard decision data comprises the value based on the normal reading level, and wherein the third sensing timing is later than the first sensing timing and is earlier than the second sensing timing.

14. The method of claim 11, comprising:

storing, at the same time as the second sensing timing, a value determined based on the normal read level in the first latch, wherein the hard decision data comprises the value based on the normal reading level, and wherein the normal read level and the second offset level are equal to each other.

15. The method of claim 11, wherein the sensing duration for the page is a second sensing duration, wherein a first sensing duration is after a first precharge of a voltage of a sensing node of the buffer unit, and wherein the second sensing duration is after a second precharge of the voltage of the sensing node, the second precharge after the first sensing duration, and wherein the method comprises storing a value determined based on the normal read level in the first latch during the first sensing duration.

16. The method of claim 15, wherein the buffer unit is connected to a corresponding bit line through a shut-off transistor, wherein storing the value determined based on the normal read level in the first latch is performed with the shut-off transistor turned off, and wherein at least one of the changing of the value stored in the second latch at the first and second sensing timings is performed with the shut-off transistor turned on.

17. The method of claim 11, comprising:

dumping the value stored in the second latch or the inverted value of the value stored in the second latch to a cache latch of the buffer unit, wherein the value stored in the second latch or the inverted value of the value stored in the second latch comprises the soft decision data; and performing compression on the soft decision data stored in the cache latch.

18. An operating method of a memory device, wherein the memory device comprises a page buffer, the page buffer comprising buffer units for a plurality of memory cells, wherein each buffer unit comprises a first latch for sensing hard decision data that is based on a normal read level and a second latch for sensing soft decision data that is based on first and second offset levels, and wherein the operating method comprises:

in response to a first read command for a first page of the memory device, performing a first precharge on a sensing node of a buffer unit of the buffer units;

storing a value determined based on the normal read level, in the first latch of the buffer unit, during a first sensing duration after the first precharge;

after the first sensing duration, performing a second precharge on the sensing node of the buffer unit;

storing, in the second latch of the buffer unit, a first sensing result, wherein the second latch is connected to an off memory cell based on the first offset level, wherein storing the first sensing result is performed at a first sensing timing of a second sensing duration, the second sensing duration after the second precharge, in response to a set signal or a reset signal; and storing, in the second latch of the buffer unit, a second sensing result, wherein the second latch is connected to an off memory cell based on the second offset level, wherein storing the second sensing result is performed at a second sensing timing of the second sensing duration in response to the other of the set signal or the reset signal.

19. The operating method of claim 18, further comprising:

dumping a value stored in the second latch or an inverted value of the value stored in the second latch, to a cache latch of the buffer unit; and outputting the soft decision data to a memory controller, wherein a logic state of the soft decision data is based on a value stored in the cache latch.

20. The operating method of claim 19, wherein a first logic state of the soft decision data corresponds to memory cells with threshold voltages smaller than the first offset level or larger than the second offset level, and wherein a second logic state of the soft decision data corresponds to memory cells with threshold voltages between the first offset level and the second offset level.

* * * * *